United States Patent
Nagafuku et al.

(10) Patent No.: US 6,904,672 B2
(45) Date of Patent: Jun. 14, 2005

(54) METHOD FOR MOUNTING AN ELECTRONIC COMPONENT

(75) Inventors: Nobuyasu Nagafuku, Kofu (JP); Noboru Nishikawa, Yamanashi (JP); Takeshi Kuribayashi, Yamanashi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 442 days.

(21) Appl. No.: 10/092,053

(22) Filed: Mar. 5, 2002

(65) Prior Publication Data

US 2002/0157488 A1 Oct. 31, 2002

(30) Foreign Application Priority Data

Mar. 6, 2001 (JP) ........................................ 2001-062227

(51) Int. Cl.$^7$ ................................................. H05K 3/34
(52) U.S. Cl. ........................ 29/840; 832/833; 832/834; 832/843; 73/865.8
(58) Field of Search .............................. 29/407.04, 721, 29/740, 830, 832–834, 840, 843; 73/865.8; 228/103–105; 382/145–147, 149–151

(56) References Cited

U.S. PATENT DOCUMENTS 5,134,665 A * 7/1992 Jyoko ........................ 382/150
5,555,316 A * 9/1996 Tsujikawa et al. .......... 382/150
6,317,972 B1 * 11/2001 Asai et al. .................... 29/833

FOREIGN PATENT DOCUMENTS

JP         05-186940    *  1/1995    ........ H05K/13/04

* cited by examiner

Primary Examiner—Minh Trinh
Assistant Examiner—Donghai D. Nguyen
(74) Attorney, Agent, or Firm—Pearne & Gordon LLP

(57) ABSTRACT

This invention provides an electronic component mounting method capable of effectively utilizing a self-alignment effect even if a mounting interval of electronic components is small. This method includes the steps of detecting a printing position of a solder paste on the circuit board and mounting an electronic component. When a solder paste on a circuit board having a land formed thereon is printed and an electronic component is mounted, the printing position of the solder paste of the circuit board is detected by a printing position detecting device included in an inspecting apparatus. Then, the electronic component is mounted by using the detected printing position of the solder paste as a reference by an electronic component mounting apparatus.

12 Claims, 24 Drawing Sheets

FIG.18(a)
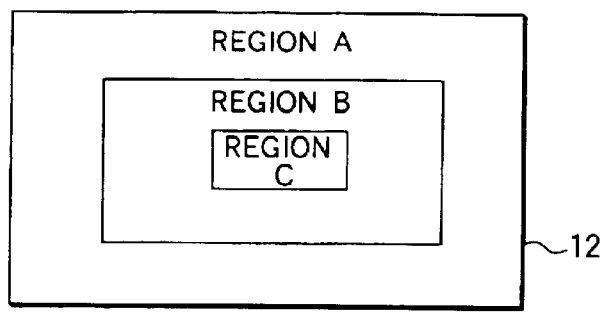
FIG.18(b)
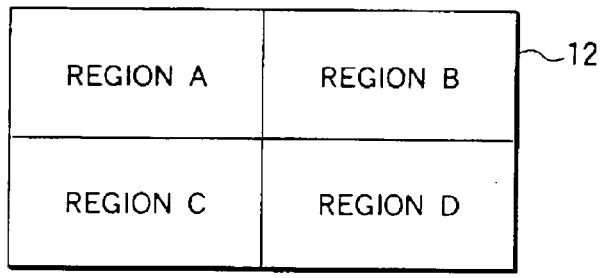
FIG.19

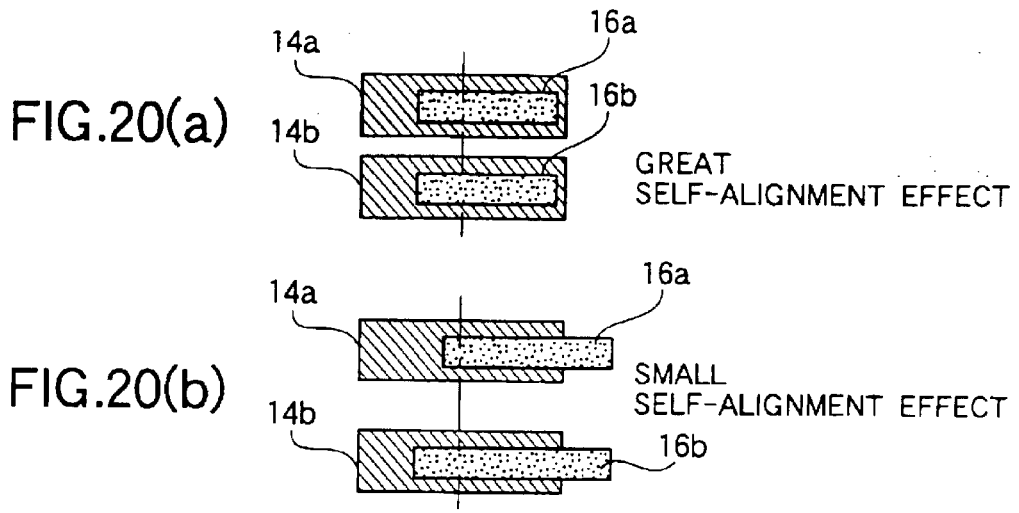
FIG.20(a) GREAT SELF-ALIGNMENT EFFECT
FIG.20(b) SMALL SELF-ALIGNMENT EFFECT
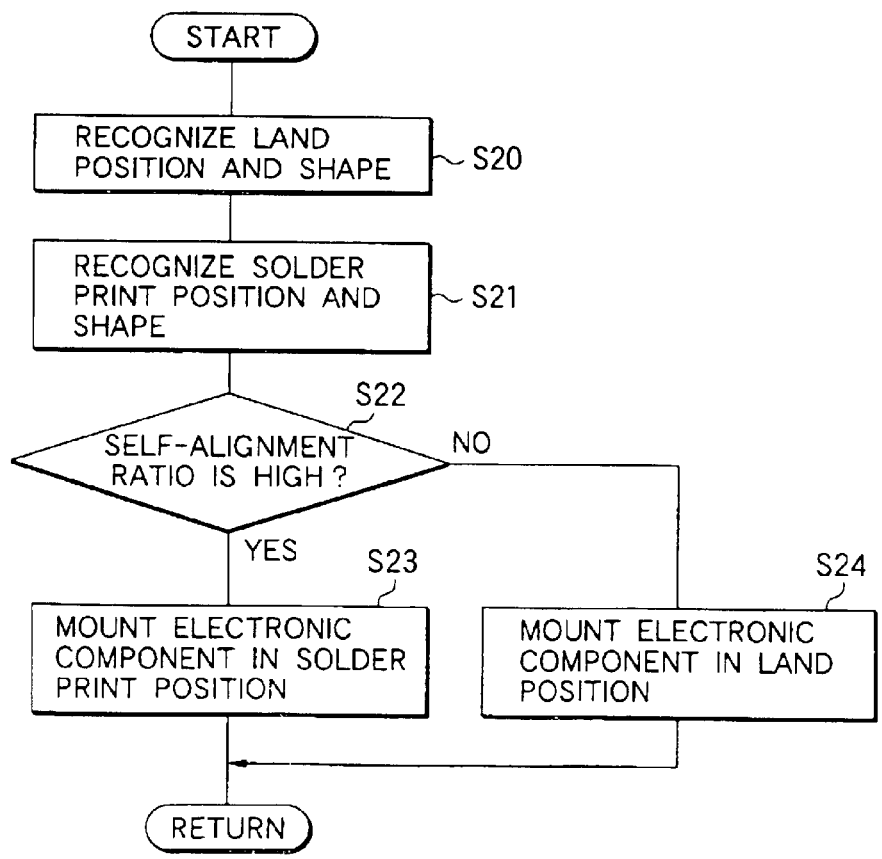
FIG.21

PRIOR ART
FIG.29
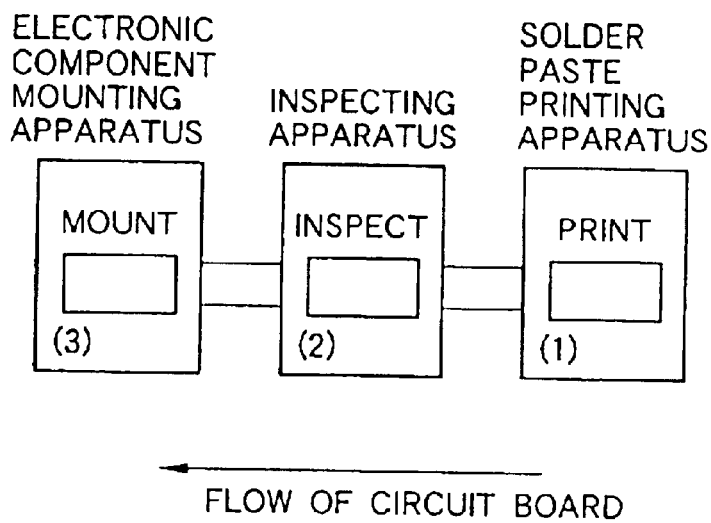
FLOW OF CIRCUIT BOARD
PRIOR ART
FIG.30(a)
PRIOR ART
FIG.30(b)
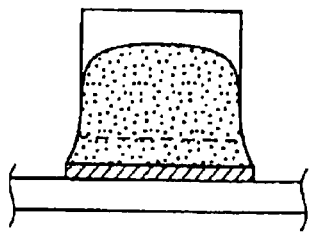
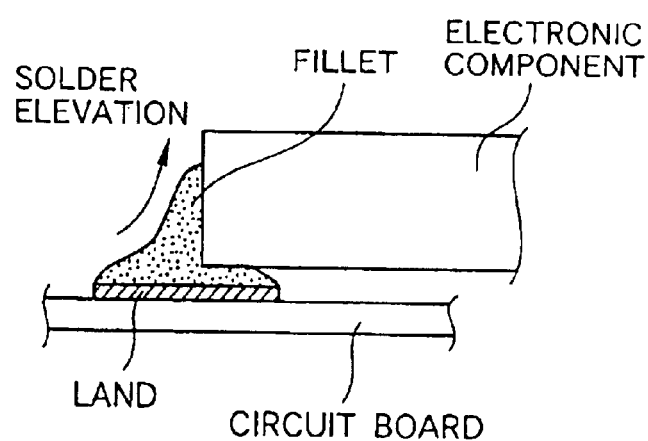

AFTER REFLOW PROCESSING

METHOD FOR MOUNTING AN ELECTRONIC COMPONENT

BACKGROUND OF THE INVENTION

1. Field of the Invention

The present invention relates to an electronic component mounting method and apparatus for mounting an electronic component on a circuit board with high precision, an electronic component mounting system, an electronic component mounting data creating method, a mounting data creating device, and a program to be used therein. More particularly, the invention relates to a technique for carrying out mounting by effectively utilizing a self-alignment effect without a failure in mounting even if there is a small interval between mounting positions of electronic components on the circuit board

2. Description of the Related Art

As shown in FIG. 29, for example, the process for manufacturing a circuit board on which an electronic component mounted includes three steps. The first step is a printing step (1) of printing a solder paste on a circuit board having a land formed thereon by means of a solder paste printing apparatus. The next step is a inspecting step (2) of inspecting the print state of the solder paste by means of a inspecting apparatus. The last is a mounting step (3) of mounting an electronic component on the circuit board by means of an electronic component mounting apparatus. The solder paste printing apparatus, the inspecting apparatus and the electronic component mounting apparatus are connected in this order over a manufacturing line respectively, and the circuit board fed to the manufacturing line is taken out through the steps (1), (2) and (3) and is sent to a reflow step which is not shown.

Recently, a mounting interval between electronic components to be mounted on a circuit board is reduced to approximately 0.15 mm and the same interval will tend to be reduced increasingly in the future. In order to reduce an interval between components to be mounted, the soldering state of the electronic component has been fillet-less. In order to make the state fillet-less, it is necessary to prevent "extension wetting" in which a molten solder overflows and occurs "solder elevation" along the end face of the terminal of the electronic component as shown in FIG. 30(b). The "solder elevation" is a phenomenon that a molten solder paste trickles upward along a electronic component when the electronic component is mounted on the solder paste. The "solder elevation" causes the "extension wetting" which causes generation of bridges between electronic components. Therefore, the width of a land to be formed on the circuit board is set to be equal to or smaller than the width of the terminal of the electronic component such that the overflowed solder does not pollute the end face of the terminal. More specifically, an excessive solder does not stick to the end face of the terminal by setting the width of the land to be equal to or smaller than the width of the terminal of the electronic component. Consequently, it is possible to prevent the solder from extensively overflowing from a terminal surface on the land side.

When an electronic component is to be soldered to the land, a solder paste is printed on the land and the electronic component is mounted in alignment with the position of the land, and a reflow process is then carried out. By the reflow process, the solder paste interposed between the land and the terminal of the electronic component is molten and fluidized. The electronic component is also moved to the center position of the land by a self-alignment effect. Consequently, mounting is carried out while positioning of the land is performed.

In the conventional soldering method, however, the mounting is carried out with a target mounting position of the electronic component in alignment with the position of the land. Therefore, in the case in which the printing position of the solder paste is shifted from the position of the land, there is a problem in that a failure in soldering is occurred after the reflow process. FIG. 31(a) shows a state in which the electronic component is mounted, in alignment with the center position of each land, on the circuit board having the solder paste printed with a shift from the position of the land. FIG. 31(b) shows a result obtained by carrying out the reflow process over the circuit board.

In the case in which a positional relationship between the mounted electronic component and the printed solder paste is such that the solder paste is protruded from the end of the electronic component as shown, "extension wetting" is occurred between the solder and the end of the electronic component during the reflow process. As a result, the solder unnecessarily floods over the side surface of the terminal of the electronic component so that a bridge is generated between the adjacent electronic components or terminals. The bridge is not generated if the mounting interval between the electronic components is wide. However, the bridges are generated frequently in the circuit board having small intervals between the electronic components particularly that causes a remarkable decline in quality of the circuit board on which is mounted electronic components.

Moreover, a solder paste printing apparatus can finely control the position of a land of a circuit board and a printing position of solder paste. However, it is hard to uniformly carry out alignment over the whole circuit board having small mounting internals of electronic components, and substantially, it is very hard to completely correct a local shift.

SUMMARY OF THE INVENTION

The invention has been made in consideration of such conventional problems. In order to solve the problems, the invention provides an electronic component mounting method and device, an electronic component mounting system, an electronic component mounting data creating method, a mounting data creating device, and a program to be used therein which can effectively utilize a self-alignment effect even if the mounting interval of an electronic component is small.

In order to solve the problems, a first aspect of the invention is directed to an electronic component mounting method for printing a solder paste on a circuit board including a land formed on the circuit board and for mounting an electronic component. The method includes the steps of detecting a printing position of the solder paste on the circuit board and mounting the electronic component by referring to the printing position of the solder paste.

In the electronic component mounting method, the printing position of the solder paste of the circuit board is detected at the printing position detecting step and the electronic component is mounted by using the detected printing position of the solder paste as a reference at the mounting step. Consequently, when the solder paste is molten by a reflow process, a self-alignment effect, which is being returned the electronic component to the position of the land by the fluidization of the solder paste, can be maintained to be great Therefore, the electronic component can be reliably fixed into the land position even if the printing position of the solder paste is shifted from the position of the land. Also in the case in which the mounting interval of the electronic component is small, moreover, it is possible to enhance precision in the mounting position of the electronic component by effectively utilizing the self-alignment effect.

A second aspect of the invention is directed to the electronic component mounting method, wherein a detected result of the printing position of the solder paste, which is an output at the printing position detecting step, is subjected to a feed-forward control to the mounting step, thereby mounting an electronic component.

In the electronic component mounting method, the detected result of the printing position, which is an output of the printing position detecting step, is feed-forward controlled form the printing position detecting step to the mounting step. Consequently, a targeted mounting position of the electronic component can be instantaneously set to be a solder paste printing position reference for the circuit board to be an object for detecting the solder paste printing position so that the electronic component can be mounted with an enhancement in the self-alignment effect.

A third aspect of the invention is directed to the electronic component mounting method, wherein a target mounting position of each electronic component is individually set based on a shift amount between a position of a land corresponding to the electronic component to be mounted and a printing position of the solder paste for the land.

In the electronic component mounting method, the shift amount between the position of the land corresponding to the electronic component and the printing position of the solder paste for the land is obtained for each electronic component. Then, the target mounting position of the electronic component is individually set based on the shift amount obtained. Consequently, an optimum target mounting position for each electronic component can be set and mounting precision can be enhanced.

A fourth aspect of the invention is directed to the electronic component mounting method, wherein a shift amount between a position of a land corresponding to the electronic component to be mounted and the printing position of the solder paste for the land is obtained for all the electronic components to be mounted on the circuit board, and a target mounting position of each of the electronic components is collectively set based on an added average value of the shift amounts thus obtained.

In the electronic component mounting method, the shift amount between the position of the land corresponding to the electronic component to be mounted and the printing position of the solder paste is obtained for all the electronic components. Then, the added average value of the shift amounts obtained is calculated. The added average value of the shift amounts is applied to all the electronic components of the circuit board to collectively set the target mounting position of each electronic component. Consequently, the target mounting position can be set simply and a time required for calculation can be shortened.

A fifth aspect of the invention is directed to the electronic component mounting method, wherein the circuit board is divided into a plurality of blocks and a shift amount between a position of a land corresponding to an electronic component to be mounted in each block and the printing position of the solder paste for the land is obtained. Then, a target mounting position of the electronic component is set for each block based on the shift amount thus obtained.

In the electronic component mounting method, the circuit board is divided into a plurality of blocks and the shift amount between the position of the land corresponding to the electronic component to be mounted in each block and the printing position of the solder paste is obtained. Based on the shift amount of each block thus obtained, the target mounting position of the electronic component is set for each block. Consequently, even if the shift amount tends to be varied for each block, a proper target mounting position can be set in each block. Moreover, it keeps a region having a small shift from being influenced by a region having a great shift and it is possible to prevent the shift from an original target mounting position of the region having the small shift from being increased. Thus, the self-alignment effect can be uniformly obtained over the whole circuit board and the mounting can be carried out with high precision in alignment.

A sixth aspect of the invention is directed to the electronic component mounting method, wherein the blocks are obtained by an annular division from a peripheral edge of the circuit board toward a center.

In the electronic component mounting method, the division is annularly carried out from the peripheral edge of the circuit board toward the center, thereby forming the blocks. Consequently, in the case in which the center of the circuit board has a small shift amount and the shift amount tends to be increased toward the peripheral edge, for example, it is possible to correct the target mounting position slightly on the center of the circuit board and greatly toward the peripheral edge. Thus, it is possible to uniformly obtain the self-alignment effect over the whole circuit board.

A seventh aspect of the invention is directed to the electronic component mounting method, wherein the block is obtained by dividing the circuit board like a lattice.

In the electronic component mounting method, the circuit board is divided into blocks like a lattice. Consequently, in the case in which the shift amount of the corner portion of the circuit board is small and tends to be increased apart from the corner portion, for example, it is possible to correct the target mounting position slightly in the corner portion and greatly apart from the corner portion. Thus, the self-alignment effect can be uniformly obtained over the whole circuit.

An eighth aspect of the invention is directed to the electronic component mounting method, wherein a self-alignment effect is decided from a shift state between a position of a land corresponding to the electronic component to be mounted and the printing position of the solder paste for the land. Then, a target mounting position of the electronic component is set by using the printing position of the solder paste as a reference when the self-alignment effect is great, while the target mounting position is set by using the position of the land as the reference when the self-alignment effect is small.

In the electronic component mounting method, the self-alignment effect, which can be expected by mounting the electronic component, is decided based on the shift state between the position of the land and the printing position of the solder paste. And then, the target mounting position of the electronic component is set by using the printing position of the solder paste as a reference when the self-alignment effect is great, while the target mounting position is set by using the position of the land as a reference when the self-alignment effect is small. Consequently, it is possible to properly change the target mounting position corresponding to the self-alignment effect which can be expected.

Moreover, it is possible to carry out the mounting such that the electronic component can always be fixed into the land position after the reflow process of the circuit board.

A ninth aspect of the invention is directed to the electronic component mounting method, wherein a correction value is set at an optional rate for a shift amount between a position of a land corresponding to the electronic component to be mounted and the printing position of the solder paste for the land. Then, the target mounting position of the electronic component is changed from the position of the land toward the printing position of the solder paste based on the correction value thus set.

In the electronic component mounting method, the correction value is set in an optional ratio of 50%, 80% or 100%, for example, with respect to the shift amount between the position of the land and the printing position of the solder paste. Therefore, the target mounting position of the electronic component is changed from the position of the land toward the printing position of the solder paste based on the correction value thus set. The self-alignment effect to be changed on fine conditions can be maintained to be optimum and the electronic component can be mounted with much higher precision.

A tenth aspect of the invention is directed to the electronic component mounting method, wherein the correction value is set based on a degree of the self-alignment effect. The self-alignment is determined depending on a shift state of the position of the land corresponding to an electronic component to be mounted from the printing position of the solder paste for the land.

In the electronic component mounting method, the correction value is set depending on the degree of the self-alignment effect determined by the shift state of the position of the land from the printing position of the solder paste. Consequently, the correction value can be directly reflected by the self-alignment effect so that the electronic component can be mounted with much higher precision.

An eleventh aspect of the invention is directed to the electronic component mounting method, wherein the correction value is set depending on a characteristic of a solder paste to be used.

In the electronic component mounting method, the correction value is set depending on the characteristic of the solder paste to be used. Consequently, it is possible to set a proper correction value corresponding to various conditions such as a material composition, a frictional characteristic or a viscosity of the solder paste.

A twelfth aspect of the invention is directed to the electronic component mounting method, wherein when the electronic component interferes with adjacent other electronic components over the circuit board during mounting of the electronic component on the circuit board, a mounting operation for the electronic component is not carried out.

In the electronic component mounting method, when mounting the electronic component to which the target mounting position is set by using the printing position of the solder paste as a reference, the mounting operation for the electronic component is not carried out over the electronic component which interferes with adjacent other electronic components on the circuit board. Consequently, it prevents from occurring a failure in mounting beforehand Moreover, it is possible to prevent the productivity of the circuit board from deteriorating.

A thirteenth aspect of the invention is directed to the electronic component mounting method, wherein when the electronic component interferes with adjacent other electronic components over the circuit board during mounting of the electronic component on the circuit board, a target mounting position of the electronic component to be mounted is changed from a printing position of a solder paste toward a position of a land to a position in which the interference is not present.

In the electronic component mounting method, when the electronic component interferes with the other electronic components during the mounting, the target mounting position of the electronic component to be mounted is changed from the printing position of the solder paste toward the position of the land to a position in which the interference is not present. Thus, it is possible to mount the electronic component without stop while maintaining the self-alignment effect to be required. Consequently, it is possible to prevent a recovery process from being carried out due to the stop of the mounting of the electronic component, and the mounting step can be thus carried out more quickly.

A fourteenth aspect of the invention is directed to the electronic component mounting method, wherein when a shift amount between a position of a land corresponding to the electronic component to be mounted and a printing position of a solder paste for the land exceeds a predetermined shift amount, a shift amount in a direction of rotation is obtained in addition to a shift amount in a horizontal direction. Then, a target mounting position and a target rotating angle of the electronic component are set based on the shift amounts in the horizontal direction and the direction of rotation.

In the electronic component mounting method, when the shift amount of the position of the land from the printing position of the solder paste exceeds a predetermined shift amount, both of the shift amount in the direction of rotation and in the horizontal direction are obtained. Then, the target mounting position and the target rotating angle of the electronic component are set based on the shift amounts in the horizontal direction and the direction of rotation. Consequently, it is possible to set the target mounting position and the target rotating angle from which a desired self-alignment effect can be obtained with high precision, and mounting precision can be thus enhanced.

A fifteenth aspect of the invention is directed to the electronic component mounting method, wherein the printing position detecting step includes the steps of picking up an image of a circuit board printed a solder paste, reproducing a shape of a land hidden in the solder paste of the image picked up by interpolating with previously registered land data, and obtaining a center of a position of the land from the shape of the land thus reproduced.

In the electronic component mounting method, the printing position detecting step picks up an image of a circuit board having a solder paste printed thereon, reproduces a shape of a land hidden in the solder paste of the image picked up by interpolating with previously registered land data, and obtains a center of a position of the land from the shape of the land thus reproduced. Consequently, also in the case in which the complete shape of the land cannot be visually recognized, the shape of the land can be reproduced by using the land data and the center of the position of the land can be obtained accurately.

A sixteenth aspect of the invention is directed to an electronic component mounting apparatus for mounting an electronic component on a circuit board having a solder paste printed for a land, wherein the electronic component is mounted on the circuit board by using, as a reference, a printing position of the solder paste of the circuit board.

In the electronic component mounting apparatus the mounting position of the electronic component is corrected by using, as a reference, the printing position of the solder paste on the detected circuit board. Thereby, the electronic component mounting apparatus carries out the mounting. Consequently, when the solder paste is molten by the reflow process, the self-alignment effect of returning the electronic component into the position of the land by the fluidization of the solder paste can be maintained to be great. Also in the case in which the printing position of the solder paste is shifted from the position of the land, the electronic component can be reliably fixed into the position of the land. Also in the case in which the mounting interval between the electronic components is small, moreover, the precision in the mounting position of the electronic component can be enhanced by effectively utilizing the self-alignment effect.

A seventeenth aspect of the invention is directed to the electronic component mounting apparatus, wherein mounting data for mounting an electronic component on a circuit board are created based on the electronic component mounting method according to any of the first to fifteenth aspects.

In the electronic component mounting apparatus, the mounting data for mounting the electronic component on the circuit board are created by the electronic component mounting apparatus. Consequently, the mounting data can be created by means of minimum equipment.

An eighteenth aspect of the invention is directed to an electronic component mounting system for printing a solder paste on a circuit board having a land formed on the circuit board and mounting an electronic component based on the electronic component mounting method according to any of the first to fifteenth aspects, including a printing position detecting device for detecting a printing position of the solder paste of the circuit board, and an electronic component mounting apparatus for mounting an electronic component based on a result of detection of the printing position.

The electronic component mounting system includes a printing position detecting device for detecting a printing position of the solder paste of the circuit board, and an electronic component mounting apparatus for mounting an electronic component based on a result of detection of the printing position. The electronic component is mounted by using the printing position of the solder paste as a reference. Consequently, when the solder paste is molten by the reflow process, the self-alignment effect of returning the electronic component into the land position by the fluidization of the solder paste can be maintained to be great. Also in the case in which the printing position of the solder paste is shifted from the position of the land, the electronic component can be reliably fixed into the position of the land. Also in the case in which the mounting interval between the electronic components is small, moreover, the precision in the mounting position of the electronic component can be enhanced by effectively utilizing the self-alignment effect.

A nineteenth aspect of the invention is directed to the electronic component mounting system, further including a solder paste printing apparatus for printing a solder paste on a circuit board having a land formed thereon by setting a position of the land to be a target position.

The electronic component mounting system includes a solder paste printing apparatus for printing a solder paste on a circuit board having a land formed thereon by setting a position of the land to be a target position. Therefore, it is possible to consistently carry out a series of processes from the printing of the solder paste to the mounting of the electronic component and to quickly feed back the print shift of the solder paste detected by the printing position detecting device to the solder paste printing step for another circuit board.

A twentieth aspect of the invention is directed to the electronic component mounting system, wherein the printing position detecting device is constituted integrally with the solder paste printing apparatus.

In the electronic component mounting system, the printing position detecting device is constituted integrally with the solder paste printing apparatus. Consequently, an installation space can be reduced and a process for delivering the circuit board can be simplified so that a high-speed process can be carried out still more.

A twenty-first aspect of the invention is directed to the electronic component mounting system, wherein the printing position detecting device is constituted integrally with the electronic component mounting apparatus.

In the electronic component mounting system, the printing position detecting device is constituted integrally with the electronic component mounting apparatus. Consequently, an installation space can be reduced and a process for delivering the circuit board can be simplified so that a high-speed process can be carried out still more.

A twenty-second aspect of the invention is directed to the electronic component mounting system, further including a host computer connected to at least the printing position detecting device and the electronic component mounting apparatus through a communication line and serving to receive a result of detection of a printing position from the printing position detecting device and to transmit a feed-forward signal to the electronic component mounting apparatus.

In the electronic component mounting system, at least the printing position detecting device and the electronic component mounting apparatus are connected to the host computer through the communication line, and the result of detection of the printing position is input from the printing position detecting device to the host computer and the feed-forward signal is output from the host computer to the electronic component mounting apparatus. Consequently, each apparatus can be generally managed. Also in the case in which a plurality of electronic component mounting systems are constructed, they can be easily connected and generally managed.

A twenty-third aspect of the invention is directed to an electronic component mounting data creating method, wherein mounting data for mounting an electronic component on a circuit board based on the electronic component mounting method according to any of the first to fifteenth aspects are created by the electronic component mounting apparatus.

In the electronic component mounting data creating method, mounting data for mounting an electronic component on a circuit board based on the electronic component mounting method according to any of the first to fifteenth aspects are created by the electronic component mounting apparatus. Consequently, it is possible to create the mounting data by means of minimum equipment.

A twenty-fourth aspect of the invention is directed to an electronic component mounting data creating method, wherein mounting data for mounting an electronic component on a circuit board based on the electronic component mounting method according to any of the first to fifteenth aspects are created by an external device connected to the electronic component mounting apparatus and the mounting data thus created are fetched into the electronic component mounting apparatus.

In the electronic component mounting data creating method, mounting data for mounting an electronic component on a circuit board based on the electronic component mounting method according to any of the first to fifteenth aspects are created by an external device connected to the electronic component mounting apparatus and are then fetched. Even if the electronic component mounting apparatus is carrying out the mounting operation, consequently, the mounting data can be created. Thus, workability for data creation can be enhanced and the operating efficiency of producing equipment can be increased.

A twenty-fifth aspect of the invention is directed to an electronic component mounting data creating method of creating mounting data for mounting an electronic component on a circuit board based on the electronic component mounting method according to any of the first to fifteenth aspects, wherein a correction amount for changing a target mounting position of the electronic component from a position of a land toward a printing position of a solder paste is collectively set based on a type of the solder paste to be used by utilizing a table previously registering a degree of a self-alignment effect for each type of the solder paste.

In the electronic component mounting data creating method, the correction amount for changing the target mounting position of the electronic component from the position of the land toward the printing position of the solder paste is collectively set by referring to the table based on the type of the solder paste to be used so that the self-alignment effect to be changed depending on various characteristics of the solder paste is obtained. Consequently, a time and labor for inputting the characteristics one by one can be omitted and the mounting data can be created easily.

A twenty-sixth aspect of the invention is directed to an electronic component mounting data creating method of creating mounting data for mounting an electronic component on a circuit board based on the electronic component mounting method according to any of the first to fifteenth aspects, wherein a correction amount for changing a target mounting position of the electronic component from a position of a land toward a printing position of a solder paste is collectively set based on an electronic component to be mounted and a type of the solder paste to be used by utilizing a table previously registering a degree of a self-alignment effect depending on a combination of a type of the electronic component and that of the solder paste.

In the electronic component mounting data creating method, the correction amount for changing the target mounting position of the electronic component from the position of the land toward the printing position of the solder paste is collectively set by using the table based on the electronic component to be mounted and the type of the solder paste to be used. Consequently, a time and labor for inputting various self-alignment effects one by one depending on the combination of the type of the electronic component and the solder paste to be used and the mounting data can be created easily.

A twenty-seventh aspect of the invention is directed to a mounting data creating device provided separately from an electronic component mounting apparatus and serving to create mounting data for mounting an electronic component on a circuit board based on the electronic component mounting method according to any of the first to fifteenth aspects.

In the mounting data creating device, the mounting data for mounting the electronic component on the circuit board are created irrespective of the electronic component mounting apparatus, and the electronic component mounting apparatus is subsequently caused to fetch the mounting data thus created. Consequently, even if the electronic component mounting apparatus is carrying out the mounting operation, the mounting data can be created. Thus, workability for data creation can be enhanced and the operating efficiency of producing equipment can be increased.

A twenty-eighth aspect of the invention is directed to a program in which mounting data for mounting an electronic component on a circuit board based on the electronic component mounting method according to any of the first to fifteenth aspects are recorded and used for an electronic component mounting apparatus.

The program recording mounting data for mounting an electronic component on a circuit board based on the electronic component mounting method according to any of the first to fifteenth aspects is used for an electronic component mounting apparatus. Consequently, it is possible to mount the electronic component with the self-alignment effect enhanced.

BRIEF DESCRIPTION OF THE DRAWINGS

FIG. 18(a) and FIG. 18(b) show patterns for dividing the circuit board into the optional number of blocks. FIG. 18(a) shows an example in which the circuit board is annularly divided into regions from the peripheral edge of the circuit board toward a center and FIG. 18(b) showing an example in which the circuit board is divided into regions like a lattice.

FIG. 19 is a diagram showing a table for various parameters of the weight and shape of the electronic component to be mounted and the solder paste to be used. FIG. 19 also shows the combination of the type of the electronic component to be actually used and the material of the solder paste by utilizing the table.

FIG. 20(a) and FIG. 20(b) show states in which the solder paste is printed into the position of a land. FIG. 20(a) shows a state in which the solder paste is printed with a shift from the center of the land. FIG. 20(b) shows a state in which the solder paste is printed with a protrusion from the land.

FIG. 21 is a flow chart according to a fifth embodiment of an electronic component mounting method in accordance with the invention.

FIG. 29 is a view showing the step of manufacturing a circuit board mounted on an electronic component according to a conventional art.

FIG. 30(a) and FIG. 30(b) are views for explanation how "extension wetting" is occurred. FIG. 30(b) shows a state of "solder elevation" in which a molten solder trickles upward along the end face of the terminal of the electronic component.

FIG. 31(a) shows a state in which an electronic component is mounted on a circuit board having a solder paste printed with a shift from the position of a land in alignment with the central position of each land. FIG. 31(b) shows a result obtained by carrying out a reflow process over the circuit board when the "extension wetting" is occurred.

DETAILED DESCRIPTION OF THE PREFERRED EMBODIMENTS

An electronic component mounting method and apparatus, an electronic component mounting system, an electronic component mounting data creating method, a mounting data creating device and a program to be used therein according to embodiments of the invention will be described below in detail with reference to the drawings.

Figure 1:
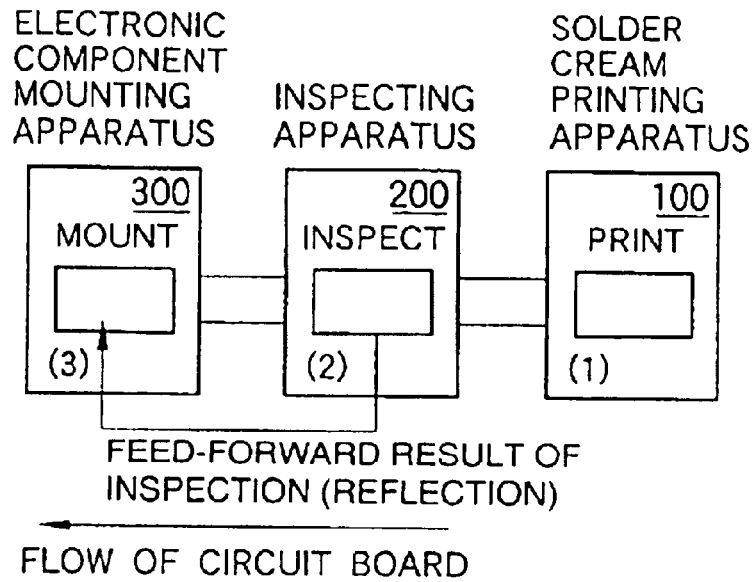
FIG. 1 is a view schematically showing the step of printing a solder paste onto a circuit board having a land formed thereon to the step of mounting an electronic component.

FIG. 1 is a view schematically showing a process for printing a solder paste on a circuit board having a land formed thereon and mounting an electronic component. In the embodiment, first of all, the circuit board is fed to a solder paste printing apparatus 100 and the solder paste is printed corresponding to the position of a land on the circuit board. Then, the land and the solder paste are recognized to inspect a shift thereof by means of a inspecting apparatus 200 in a latter stage. The result of the inspection is transmitted to an electronic component mounting apparatus 300 in a further latter stage and the circuit board having the solder paste printed thereon is fed to the electronic component mounting apparatus 300. The electronic component mounting apparatus 300 corrects the mounting position of the electronic component based on the result of the inspection which is transmitted from the inspecting apparatus 200 with respect to the fed circuit board, and the electronic component is mounted in the corrected position. The basic contents of a process for manufacturing the circuit board are described above. The invention is characterized in that the electronic component is mounted by using, as a reference, the printing position of the solder paste printed on the circuit board. In this specification, the solder paste implies a paste-like solder obtained by mixing solder powder into a flux having a high viscosity.

Detailed description will be given to the principle of the electronic component mounting method of mounting an electronic component by using a solder paste printing position as a reference according to the invention.

Figure 2:
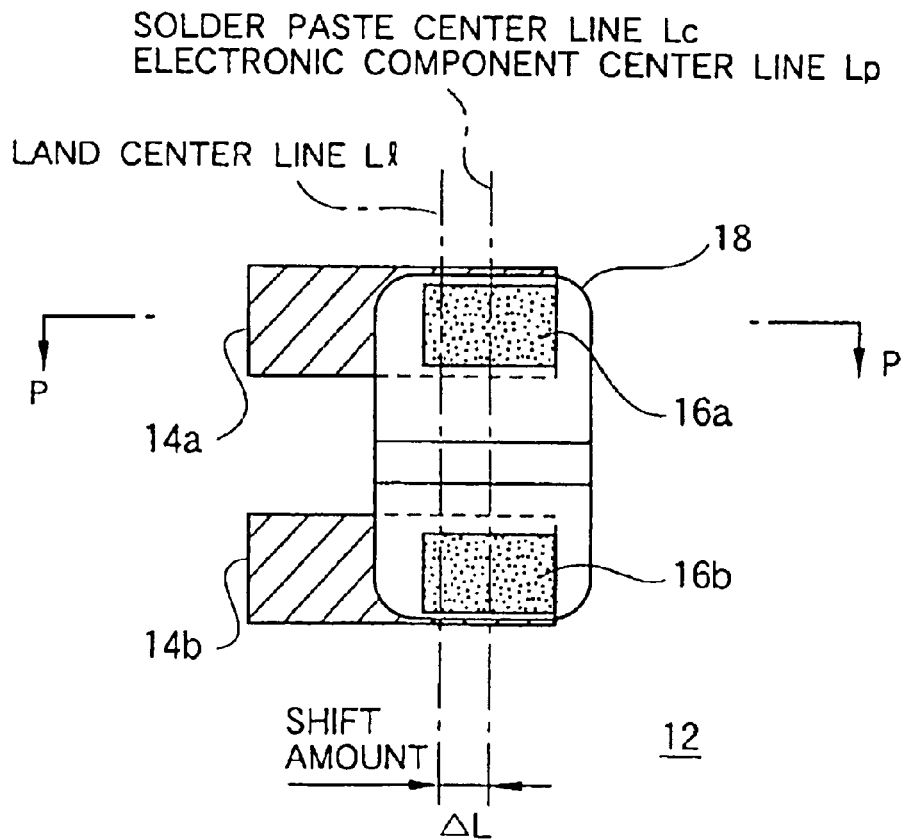
FIG. 2 is a view showing a positional relationship between the land formed on the circuit board, the printed solder paste and the electronic component to be mounted.
Figure 3A:
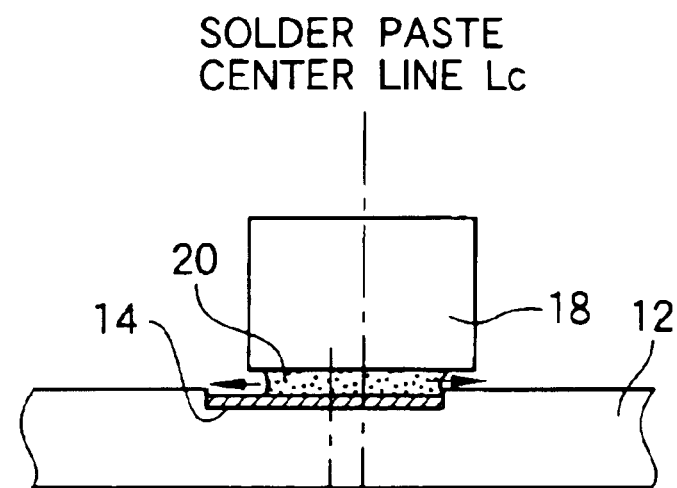
FIGS. 3(a), (b) and (c) are views illustrating the self-alignment effect of the mounted electronic component in a P—P section of FIG. 2.
Figure 3B:
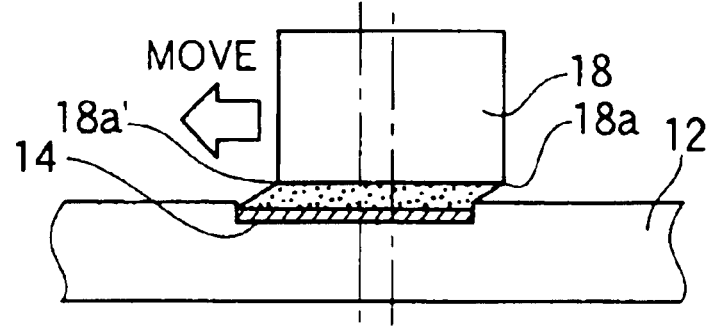
Figure 3C:
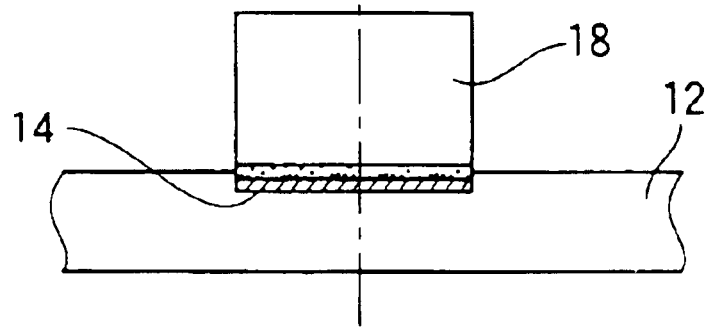
Figure 4A:
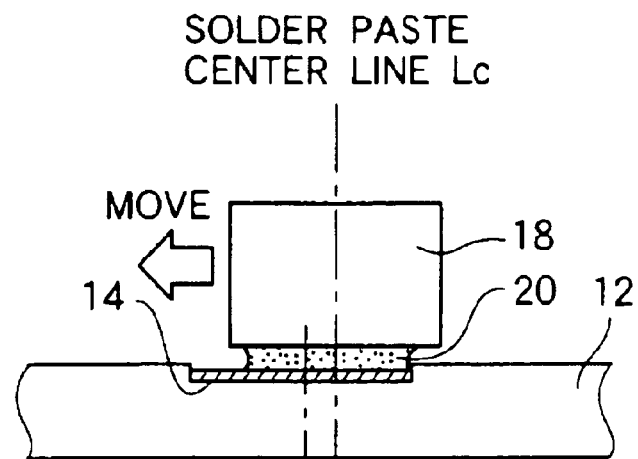
FIGS. 4(a), (b) and (c) are views illustrating the self-alignment effect of the mounted electronic component in the P—P section of FIG. 2.
Figure 4B:
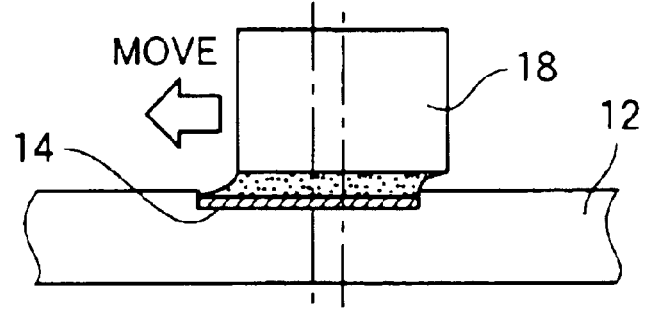

FIG. 2 is a view showing a positional relationship between a land formed on a circuit board, a printed solder paste and an electronic component to be mounted, and FIGS. 3 and 4 are views illustrating the self-alignment effect of the mounted electronic component in a P—P section of FIG. 2, respectively.

As shown in FIG. 2, solder pastes 16a and 16b are printed on lands 14a and 14b formed on a circuit board 12 in a position shifted from a land center line L1 by a distance ΔL. In this case, an electronic component 18 is mounted in alignment with the positions of the solder pastes 16a and 16b and a center line Lc of the solder pastes 16a and 16b is almost coincident with a center line Lp of the electronic component. When the reflow process is carried out in this state, the solder paste is molten and fluidized over the land. In the early stage of the fluidization, a solder 20 extensively wets due to "immersion wetting" which is generally caused during capillary permeation as shown in FIG. 3(a). When the solder 20 extensively wets both end faces 18a and 18a' of the electronic component 18 as shown in FIG. 3(b), the "extension wetting" of the solder on the component end face side is stopped and only the solder on the land 14 side extensively wets. Consequently, the solder 20 moves the electronic component 18 in the direction of an arrow to bring a stable state having a dynamic balance. This acts as the self-alignment effect so that the electronic component 18 is finally provided in such a position that the center line L1 of the land 14 is coincident with the center line Lp of the electronic component 18 as shown in FIG. 3(c).

Figure 4C:
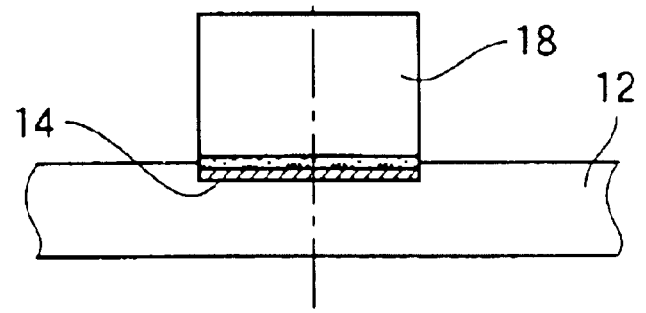

In some cases, moreover, the self-alignment effect acts as shown in FIG. 4. When the solder 20 is molten as shown in FIGS. 4(a) and (b), the electronic component 18 is moved with the "extension wetting" generated by the "immersion wetting" so that the self alignment effect can be obtained. When the "extension wetting" of the solder 20 over the land 14 is completed and the solder 20 is brought into the stable state having a dynamic balance as shown in FIG. 4(c), the movement of the electronic component 18 is also stopped. Accordingly, the electronic component 18 is finally provided in such a position that the center line L1 of the land 14 is coincident with the center line Lp of the electronic component 18.

According to such a self-alignment effect, in the case in which the electronic component is to be mounted by setting the land position to be the target mounting position, a probability that the shift of the electronic component will be corrected is approximately 50% when a shift of 50 μm or more is caused, for example. On the other hand, in the case in which the electronic component is to be mounted by setting the position of the printed solder paste to be the target mounting position, the shift can be corrected with a probability of 80 to 90% by the self-alignment effect even if the shift of 50 μm or more is caused.

Next, description will be given to an example of a structure of the electronic component mounting system for mounting an electronic component by using the self-alignment effect. The specific structures of the solder paste printing apparatus 100, the inspecting apparatus 200 and the electronic component mounting apparatus 300 according to the embodiment will be described below.

Figure 5:
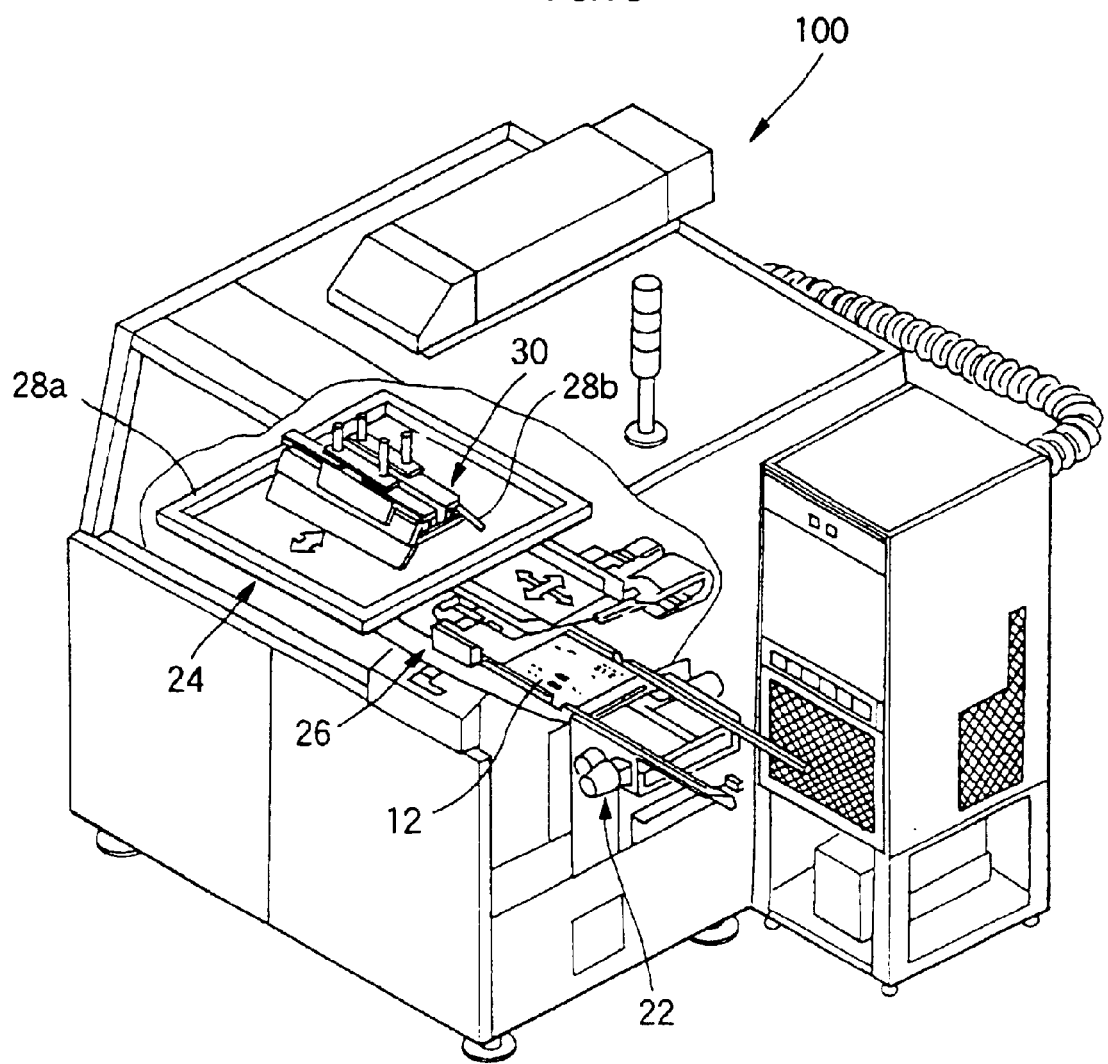
FIG. 5 is a perspective view showing the appearance of a printer, a part of which is taken away.

First of all, the solder paste printing apparatus according to the embodiment (which will be hereinafter referred to as a printer) can have a structure shown in FIG. 5, for example. FIG. 5 is a perspective view showing the appearance of the printer 100, a part of which is taken away. The printer 100 includes a circuit board delivering unit 22 for delivering the circuit board 12 to be a solder paste printing object into and from the printer 100, a table unit 26 for mounting the delivered circuit board 12 thereon to be moved to the lower surface of a printing mask 24, and a printing unit 30 for printing the solder paste by squeegees 28a and 28b above the circuit board 12 positioned on the lower surface of the printing mask 24.

According to the printer 100, the circuit board 12 is delivered in the following manner. More specifically, the circuit board delivering unit 22 receives the circuit board 12 delivered from a stocker or a line and feeds the circuit board 12 to the table unit 26 provided in the printer 100. The table portion 26 positions and fixes the circuit board 12 thus fed, and moves the circuit board 12 to a predetermined position on the lower surface of the printing mask 24 of the printing unit 30. Moreover, when is the printing process of the printing unit 30 is completed, the table unit 26 delivers the circuit board 12 from the printing unit 30 to the circuit board delivering portion 22. Then, the circuit board delivering unit 22 takes the circuit board 12 from the table unit 26 and discharges the circuit board 12 to a delivery outlet, which is not shown.

Figure 6:
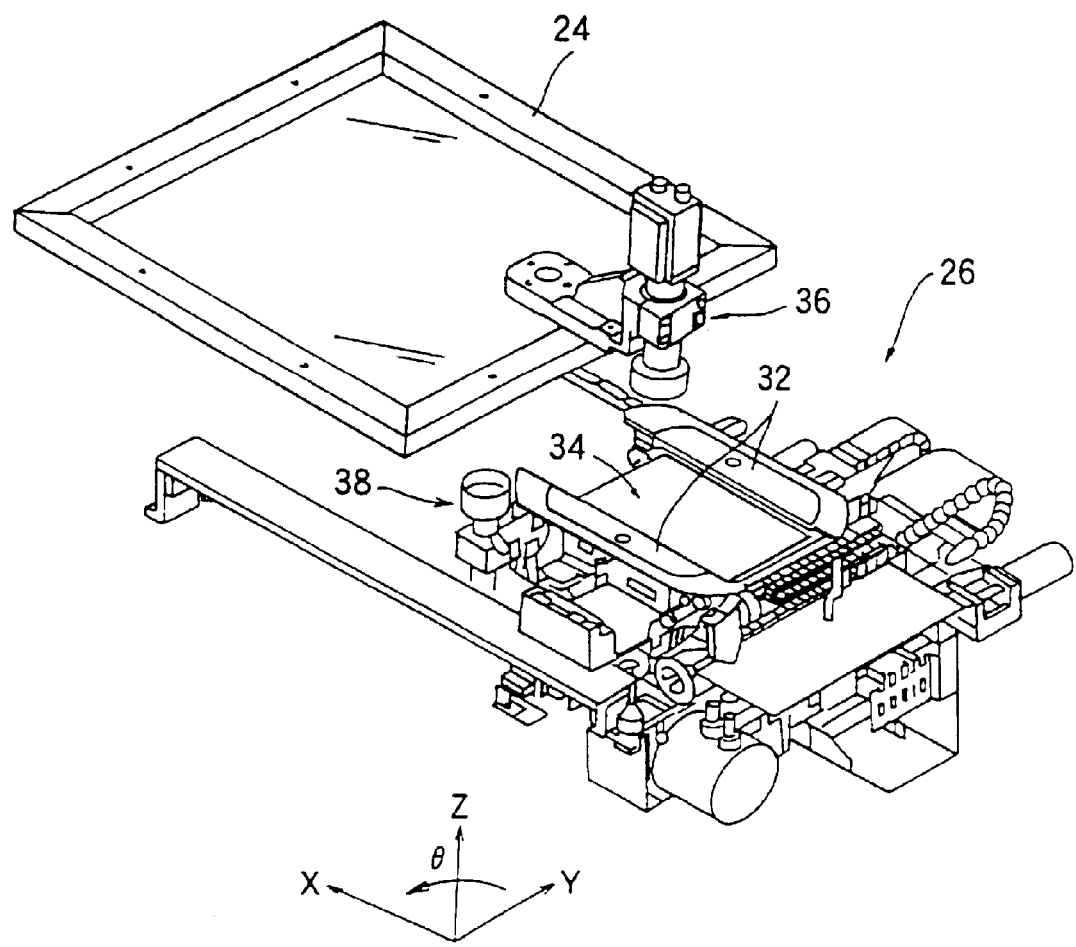
FIG. 6 is a view showing the detailed structure of a table portion.

FIG. 6 shows the detailed structure of the table unit 26. The table portion 26 includes a board mounting table 34 capable of fixing the circuit board 12 through a holding member 32 and moving and rotating the circuit board 12 by a motor control in directions of X, Y, Z and θ shown in the drawing, a board recognizing camera 36 for recognizing an alignment mark on the circuit board 12, and a mask recognizing camera 38 for recognizing an alignment mark on the printing mask 24.

The board recognizing camera 36 picks up the image of the alignment mark provided previously on the circuit board 12 to be a printing object which is fed from the circuit board delivering unit 22 to the table unit 26. The image thus picked up is processed to recognize a mark position. Consequently, the position of the circuit board 12 can be managed accurately and the positioning can be carried out in a predetermined position for printing with high precision.

Moreover, the mask recognizing camera 38 picks up the image of the alignment mark provided previously on the printing mask 24. The image thus picked up is processed to recognize a mark position. Consequently, the circuit board 12 can be positioned with high precision in a proper position corresponding to the perforation pattern of the printing mask 24. The circuit board delivering unit 22 and the table unit 26 can be constituted by using a loader, an unloader and a 4-axis stage which are generally used widely.

Figure 7:
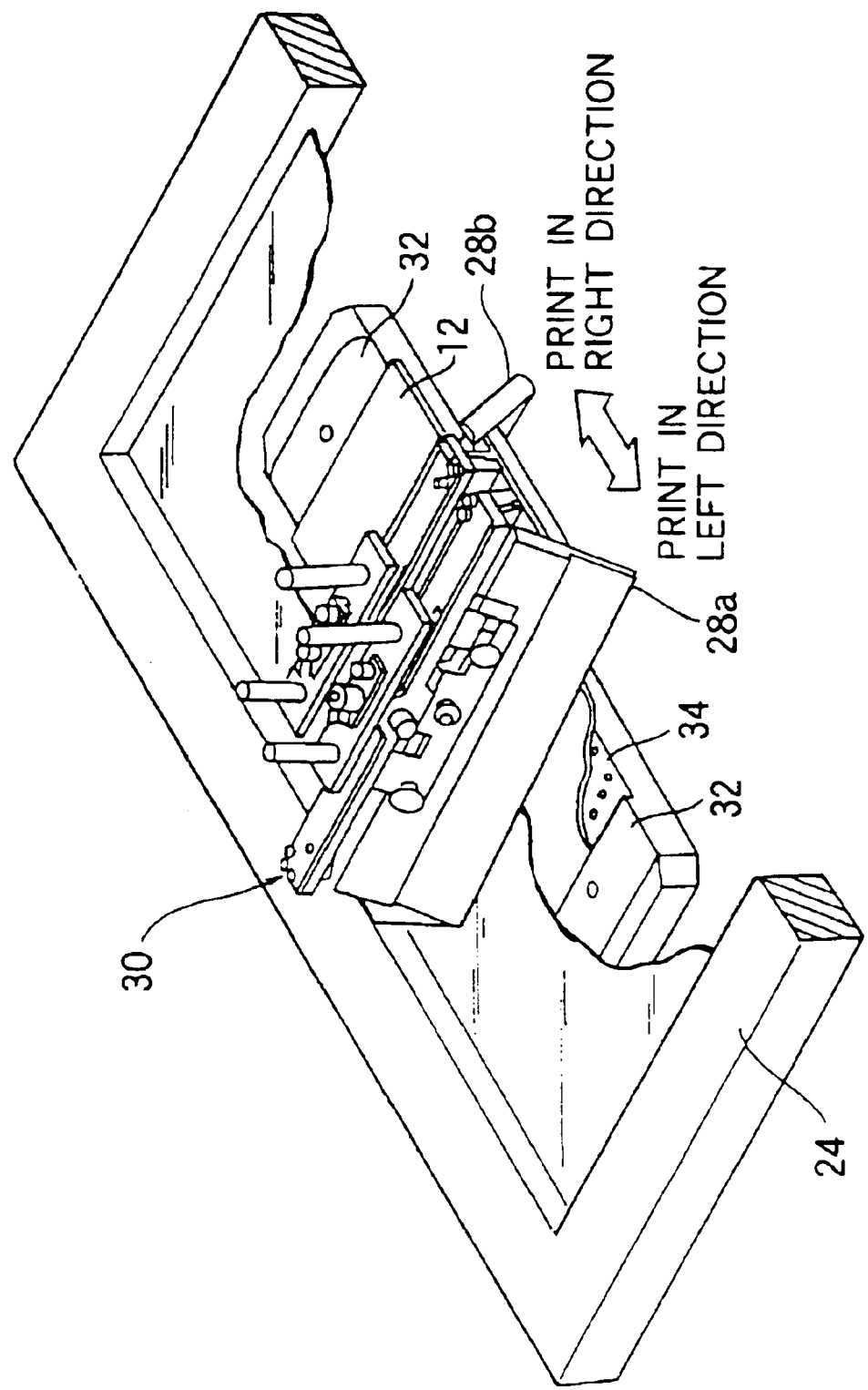
FIG. 7 is a perspective view showing a print unit, a part of which is a section.

FIG. 7 is a perspective view showing the printing unit 30, a part of which is a section. The printing unit 30 moves a pair of squeegees 28a and 28b in both forward and backward print directions on the upper side of the printing mask 24 in such a state that the circuit board 12 fixed onto the board mounting base 34 by the holding member 32 is provided on the lower side of the printing mask 24. Thus, the solder paste is printed on the circuit board 12. The squeegee 28a is used during the printing in the backward direction and the squeegee 28b is used during the printing in the forward direction.

After the solder paste is printed in the position of the land formed on the circuit board 12 by using the printer 100 having the structure described above, the printed circuit board 12 is taken out of the printer 100 and is fed to the inspecting apparatus 200 in the latter stage.

Figure 8:
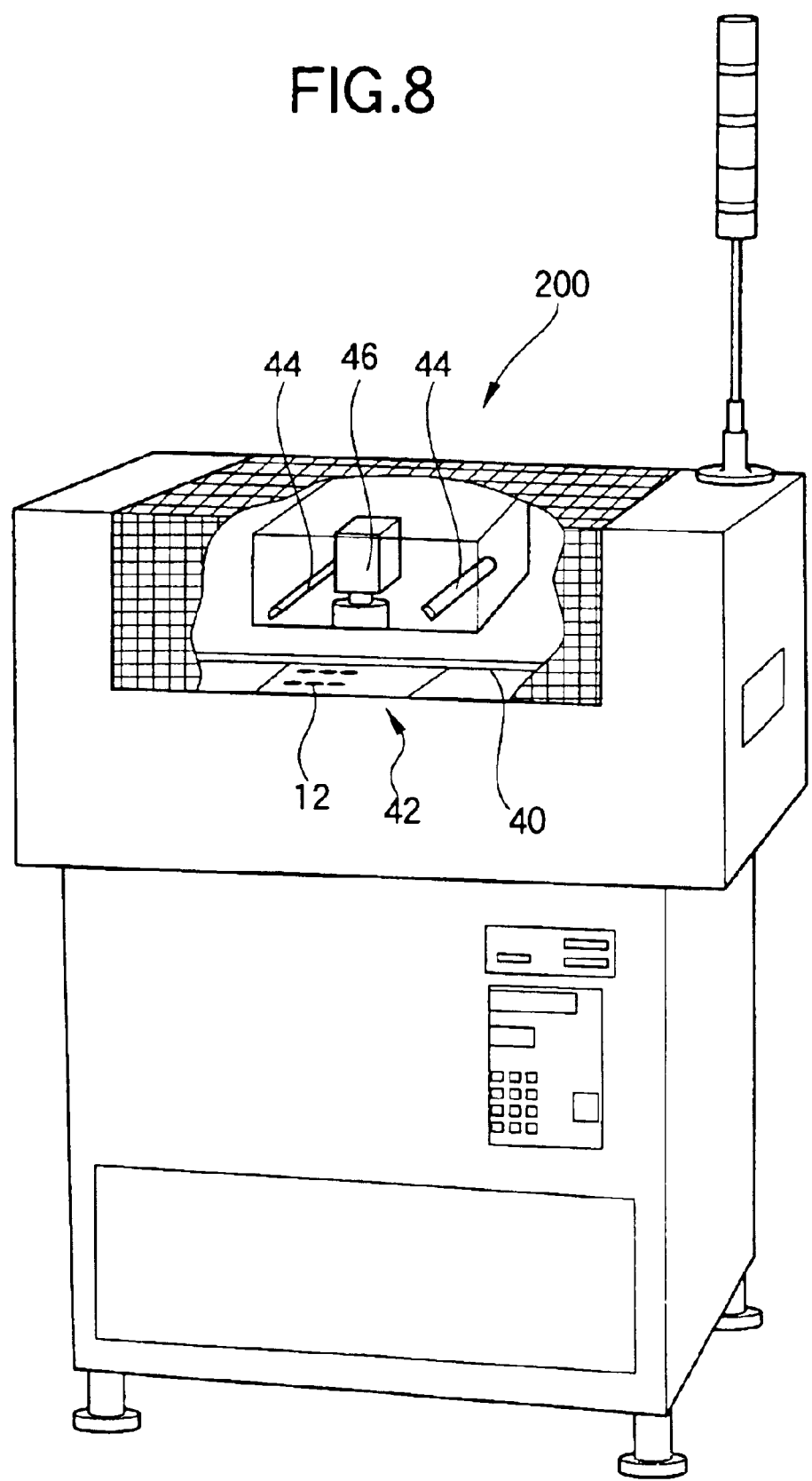
FIG. 8 is a perspective view showing the appearance of the structure of a inspecting apparatus, a part of which is taken away.

Next, the structure of the inspecting apparatus 200 will be described. FIG. 8 is a perspective view showing the appearance of the structure of the inspecting apparatus 200, a part of which is taken away. The inspecting apparatus 200 includes a printing position detecting device for detecting the printing position of the solder paste printed on the circuit board. The inspecting apparatus 200 includes a board delivering portion 40 for delivering the circuit board 12 thus fed, light sources 44 and 44 such as fluorescent lamps for illuminating the circuit board 12 stationary in a inspecting unit 42 in an oblique direction, and an image pick-up camera 46 for picking up the image of a board surface from above the circuit board 12. In the inspecting apparatus 200, the image of the circuit board 12 illuminated by the light sources 44 and 44 is picked up by the image pick-up camera 46 and the image thus picked up is processed by a controller (not shown) provided in the inspecting apparatus 200. Consequently, each land of the circuit board 12 and the printed solder paste are detected to obtain a corresponding shift amount thereof. Information about the shift amount thus obtained is once retained in the controller and is transmitted as a result of check to the electronic component mounting apparatus 300 in the latter stage.

Moreover, the result of inspection is fed back to the solder paste printing apparatus 100 and the solder paste printing apparatus 100 is regulated to quickly correct the print shift of the solder paste.

Next, the structure of the electronic component mounting apparatus will be described.

Figure 9:
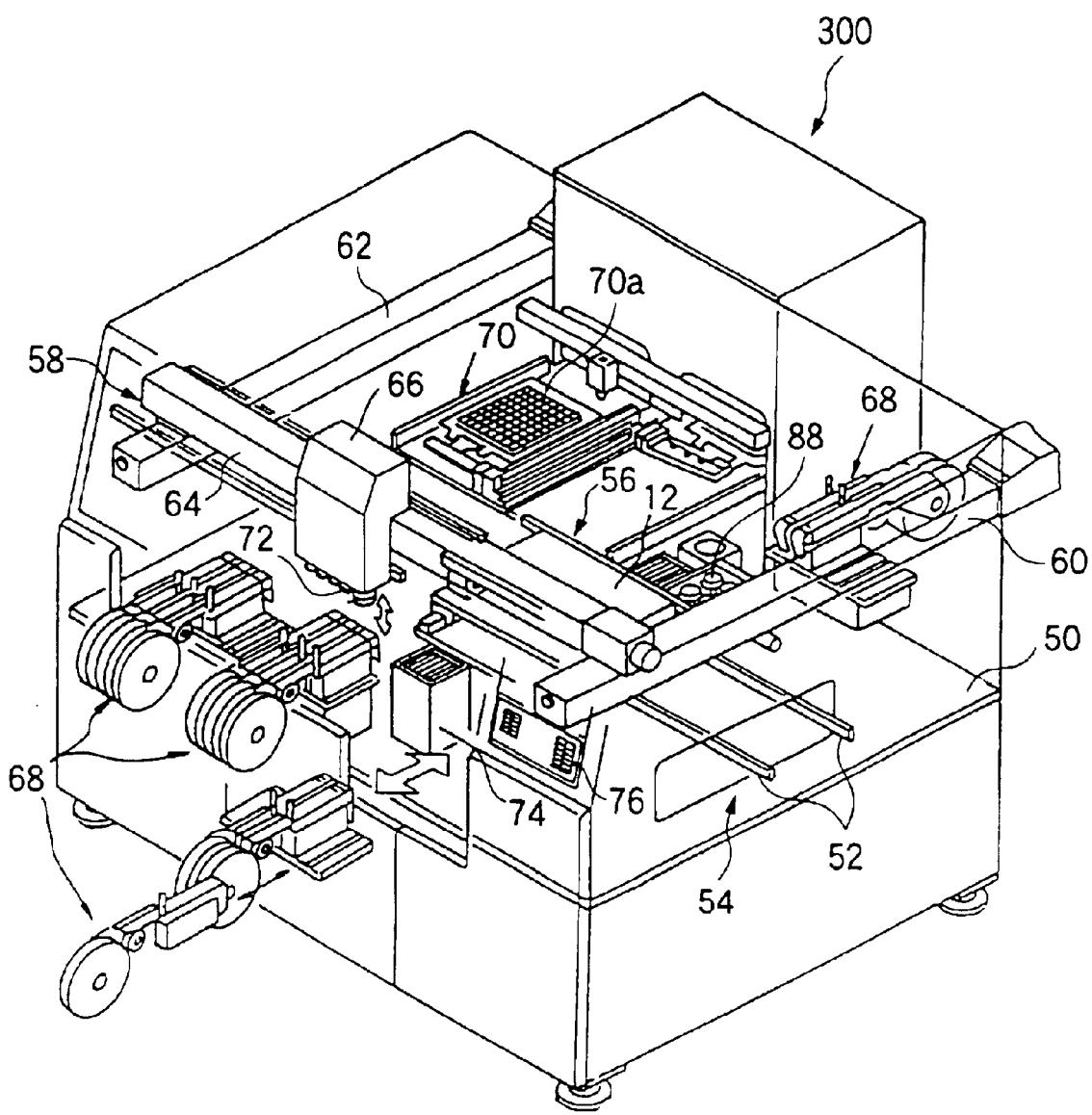
FIG. 9 is a perspective view showing an electronic component mounting apparatus.
Figure 10:
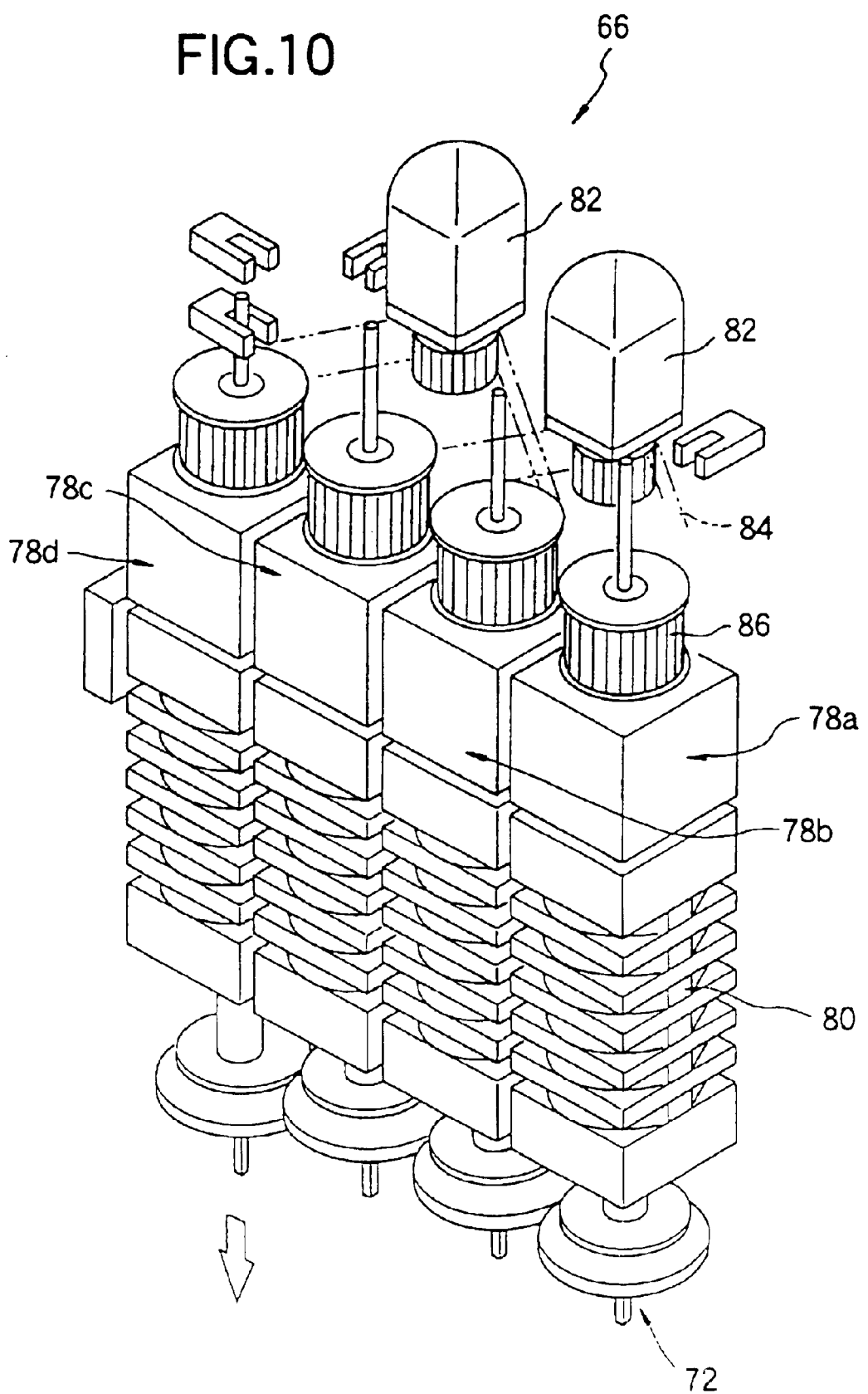
FIG. 10 is an enlarged perspective view showing the transfer head of the electronic component mounting apparatus.
Figure 11:
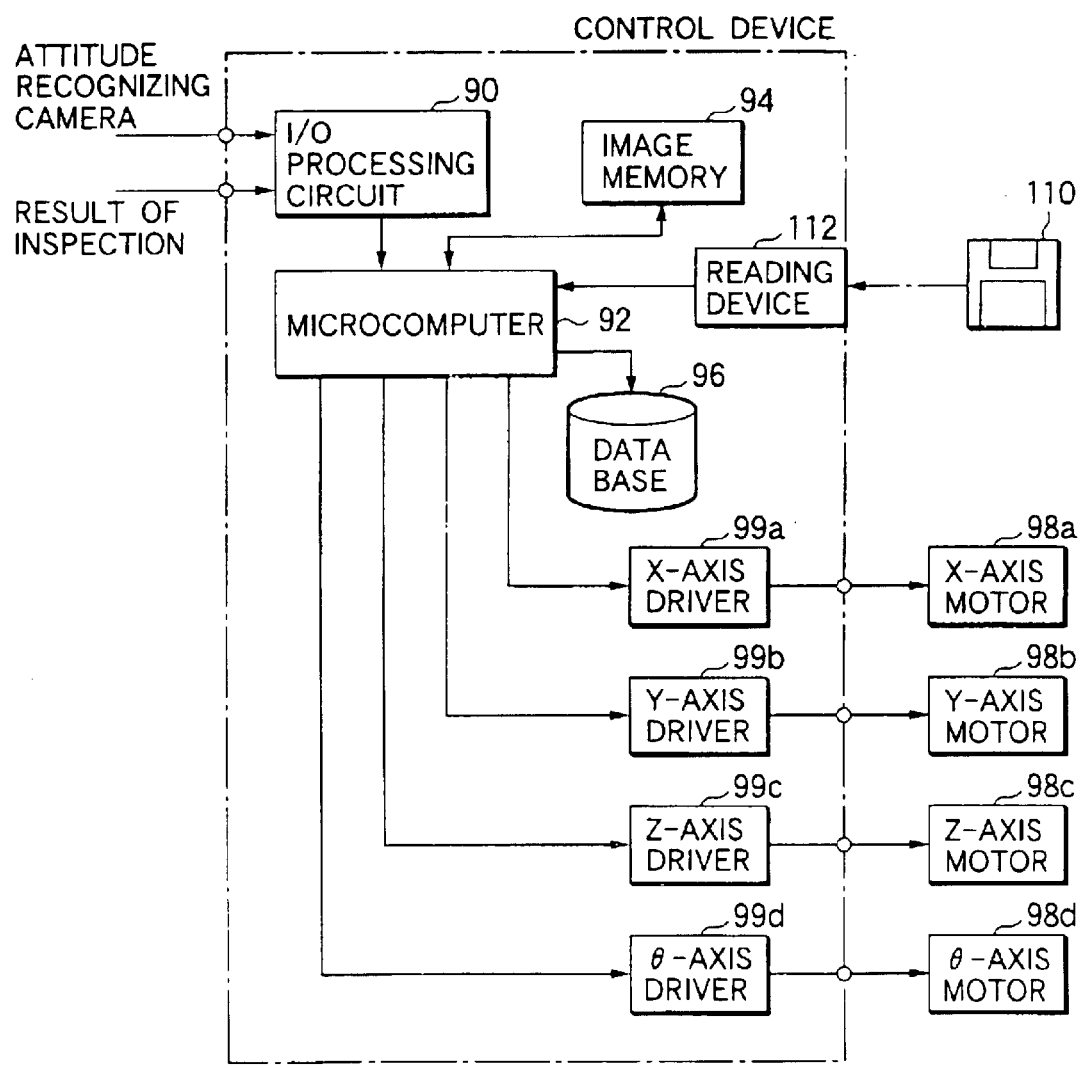
FIG. 11 is a block diagram showing the structure of a control device for controlling the electronic component mounting apparatus.
Figure 12:
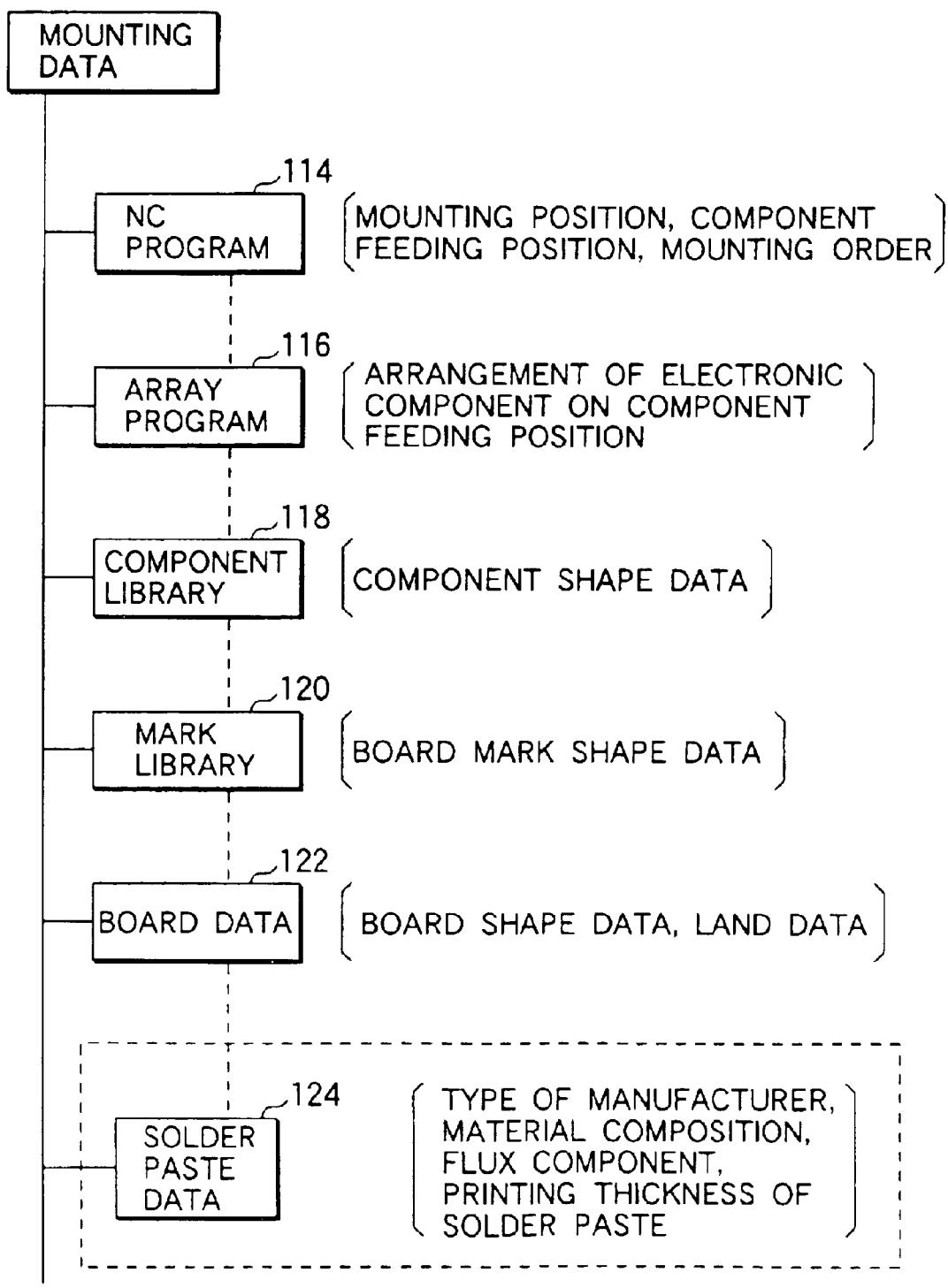
FIG. 12 is a block diagram showing the structure of mounting data to be used in the electronic component mounting apparatus.

FIG. 9 is a perspective view showing the electronic component mounting apparatus, FIG. 10 is an enlarged perspective view showing the transfer head of the electronic component mounting apparatus, FIG. 11 is a block diagram showing the structure of a control device for controlling the electronic component mounting apparatus, and FIG. 12 is a block diagram showing the structure of mounting data to be used in the electronic component mounting apparatus.

The structure of the electronic component mounting apparatus 300 will be simply described. As shown in FIG. 9, the electronic component mounting apparatus 300 is provided with a guide rail 52 of the circuit board 12 on the center of the upper surface of a base 50, and the circuit board 12 is delivered from a board delivery-in unit 54 on one of end sides to a mounting position 56 of the electronic component, and furthermore, from the mounting position 56 to a board delivery-out unit 58 on the other end side through the delivery belt of the guide rail 52.

Y tables 60 and 62 are provided in both side portions of the upper surface of the base 50 provided above the circuit board 12 respectively, and an X table 64 is provided between the two Y tables 60 and 62. Moreover, a transfer head 66 is attached to the X table 64. Consequently, the transfer head 66 can be moved in an X-Y plane.

The transfer head 66 mounted on an XY robot including the X table 64 and the Y tables 60 and 62 and movable over the X-Y plane (horizontal plane) is constituted such that a desirable electronic component is held through an suction nozzle 72 from a component feeding member 68 for feeding an electronic component such as a resistance chip or a chip capacitor or a component feeding tray 70 for feeding a comparatively large-sized electronic component such as an IC, for example, an SOP or a GFP or a connector and the sucking attitude of the electronic component is detected from a recognizing device 74 and the electronic component is then mounted in the predetermined position of the circuit board 12. Such an electronic component mounting operation is controlled based on a preset mounting program (hereinafter referred to as mounting data) by the control device. Data can be input to the control device through an operation panel 76.

A large number of component feeding member 68 are arranged on both ends of the guide rail 52 and a tape-shaped component roll accommodating an electronic component such as a resistance chip or a chip capacitor is attached to each of the component feeding member 68.

Moreover, the component feeding tray 70 can mount two trays 70a in total which are elongated in a direction orthogonal to the guide rail 52, and each of the trays 70a is so constituted as to slide toward the guide rail 52 side corresponding to the number of components to be fed, thereby maintaining a component take-out position in a Y direction to be a constant position.

The recognizing device 74 for detecting the two-dimensional shift (sucking attitude) of the electronic component held in the suction nozzle 72 and for correcting the shift on the transfer head 66 side is provided in the side portion of the circuit board 12 positioned on the guide rail 52. The attitude recognizing camera is provided in a bottom portion on the inside of the recognizing device 74 and a plurality of light emitting elements such as a light emitting diode LED for illuminating the electronic component held in the suction nozzle 72 are provided in a multi-stage on the internal surface of a housing around the attitude recognizing camera. Consequently, light can be irradiated on the mounting surface of the electronic component at a desirable angle and an image can be picked up at a proper illumination angle according to the type of the component. The illumination angle is set for each electronic component based on preset data for component recognition. Moreover, the image pick-up data obtained by the recognizing device 74 are subjected to a recognition process by the control device, and the central position or the electrode position of the electronic component is recognized and is used for correction data on a mounting position and an angle.

As shown in FIG. 10, the transfer head 66 is constituted as a multiple multi-head having a plurality of (four in the embodiment) attachment heads (a first attachment head 78a, a second attachment head 78b, a third attachment head 78c and a fourth attachment head 78d) coupled in a transverse direction. The four attachment heads 78a to 78d have the same structure and include the suction nozzle 72, an actuator 80 for causing the suction nozzle 72 to carry out a vertical operation, and a motor 82, a timing belt 84 and a pulley 86 for rotating the suction nozzle 72 itself.

The suction nozzle 72 of each attachment head is exchangeable and other suction nozzles are previously accommodated in a nozzle stocker 88 provided on the base 50 of the electronic component mounting apparatus 300. Examples of the suction nozzle 72 include an S size nozzle for holding a very small chip component having a size of approximately 1.0×0.5 mm and an M size nozzle for holding a QFP of 18 mm square which are selectively used depending on the type of the electronic component to be attached.

In a block diagram of FIG. 11 showing a main structure, the control device includes an I/O processing circuit 90 for digitally converting an image signal sent from the attitude recognizing camera of the recognizing device 74 and fetching the signal thus obtained and for fetching a result of check from the inspecting apparatus 200, a microcomputer 92 for fetching digital data through the I/O processing circuit 90 and carrying out various information processings such as an image processing, an image memory 94 for storing image data, and a data base 96 storing various mounting data for executing a predetermined control program. Moreover, the control device includes drivers 99a to 99d for driving X, Y, Z and θ axes to drive motors 98a and 98b for controlling X-axis and Y-axis movement of an XY robot shown in FIG. 9 in response to an instruction sent from the microcomputer 92, a motor 98c (an actuator 80) for controlling Z-axis movement for the attachment heads 78a to 78d shown in FIG. 11, and a motor 98d (motor 82) for controlling θ-axis movement.

Furthermore, the control device includes a reading device 112 for reading mounting data for carrying out the mounting operation for mounting the electronic component on at least the circuit board 12 from an information storage medium (for example, a magnetic recording medium, a magneto-optic recording medium, an optical recording medium or a solid-state storage element such as a flash memory) 110 storing the mounting data. The mounting data may be provided from the information recording medium 110 through a network to be a communication line.

The mounting data include an NC program 114 recording information about a mounting position onto the circuit board 12, a component feeding position in the component feeding member 68 or the component feeding tray 70, or a mounting order, an array program 116 recording information about the arrangement of the electronic component in each component feeding position, a component library 118 recording information about the shape of the electronic component, a mark library 120 recording information about the shape of a board mark such as a mark for aligning the circuit board, and board data 122 recording information about the shape of the circuit board and the shape of a land.

Next, description will be given to the mounting operation to be carried out by the electronic component mounting apparatus 300 having the structure described above.

First of all, the circuit board 12 delivered from the inspecting apparatus 200 is fed from the board delivery-in portion 54 of the guide rail 52 into the device and is delivered to the predetermined mounting position 56. Moreover, the result of inspection, which is transmitted from the inspecting apparatus 200, is input to the control device.

Subsequently, the transfer head 66 is moved in the X-Y plane through the XY robot to adsorb and hold a predetermined electronic component from the component feeding member 68 or the component feeding tray 70 based on a preset mounting program. Then, the transfer head 66 is moved onto the attitude recognizing camera of the recognizing device 74 with the electronic component held so that the sucking attitude of the electronic component is recognized. Consequently, a positional relationship between the suction nozzle 72 and the electronic component thus sucked and held is detected. Based on the result of inspection which is input from the inspecting apparatus 200, then, the target mounting position of the electronic component is changed from the position of a land to be usually used to the printing position of the solder paste and a shift of the suction nozzle 72 from the electronic component which is caused by the recognized sucking attitude is corrected to mount the electronic component on the circuit board 12.

The operation for changing a target mounting position and a correcting operation depending on the recognized sucking attitude can be carried out by causing the XY robot to have shift amounts in X and Y directions as offsets and rotating the suction nozzle 72 through the motor 82 by a shift amount for a rotating component, for example.

Figure 13:
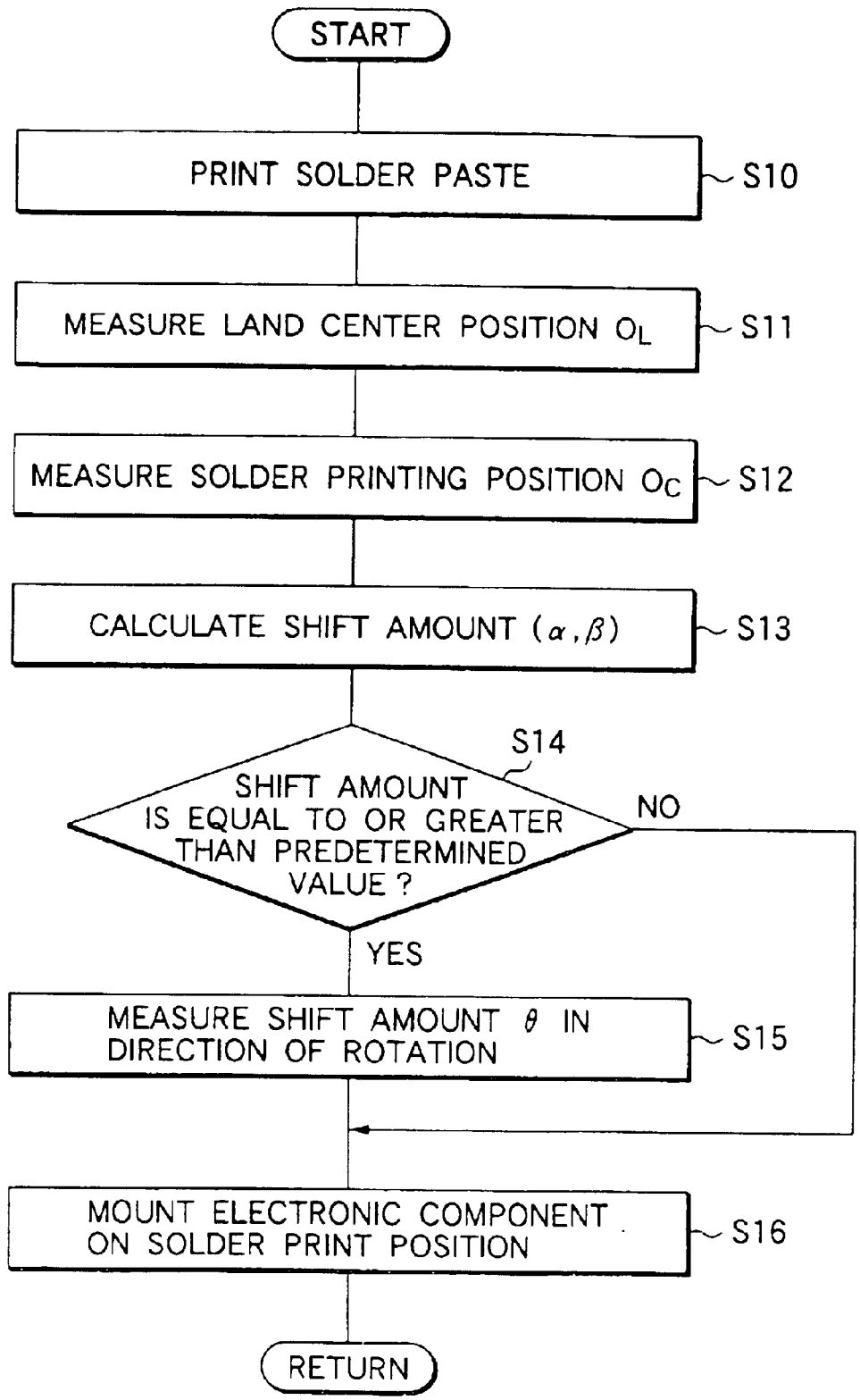
FIG. 13 is a flow chart showing the procedure for changing the target mounting position of an electronic component from the position of a land to be usually used to the printing position of a solder paste.

A procedure for changing the target mounting position of the electronic component from the position of the land to be usually used to the printing position of the solder paste based on the result of inspection which is input from the inspecting apparatus 200 will be described in detail with reference to a flow chart shown in FIG. 13.

First of all, the circuit board 12 is delivered into the printer 100 and a solder paste is printed corresponding to each land formed on the circuit board 12 (S10). Then, the circuit board 12 is delivered from the printer 100 and is delivered into the inspecting apparatus 200 in a latter stage.

Figure 14:
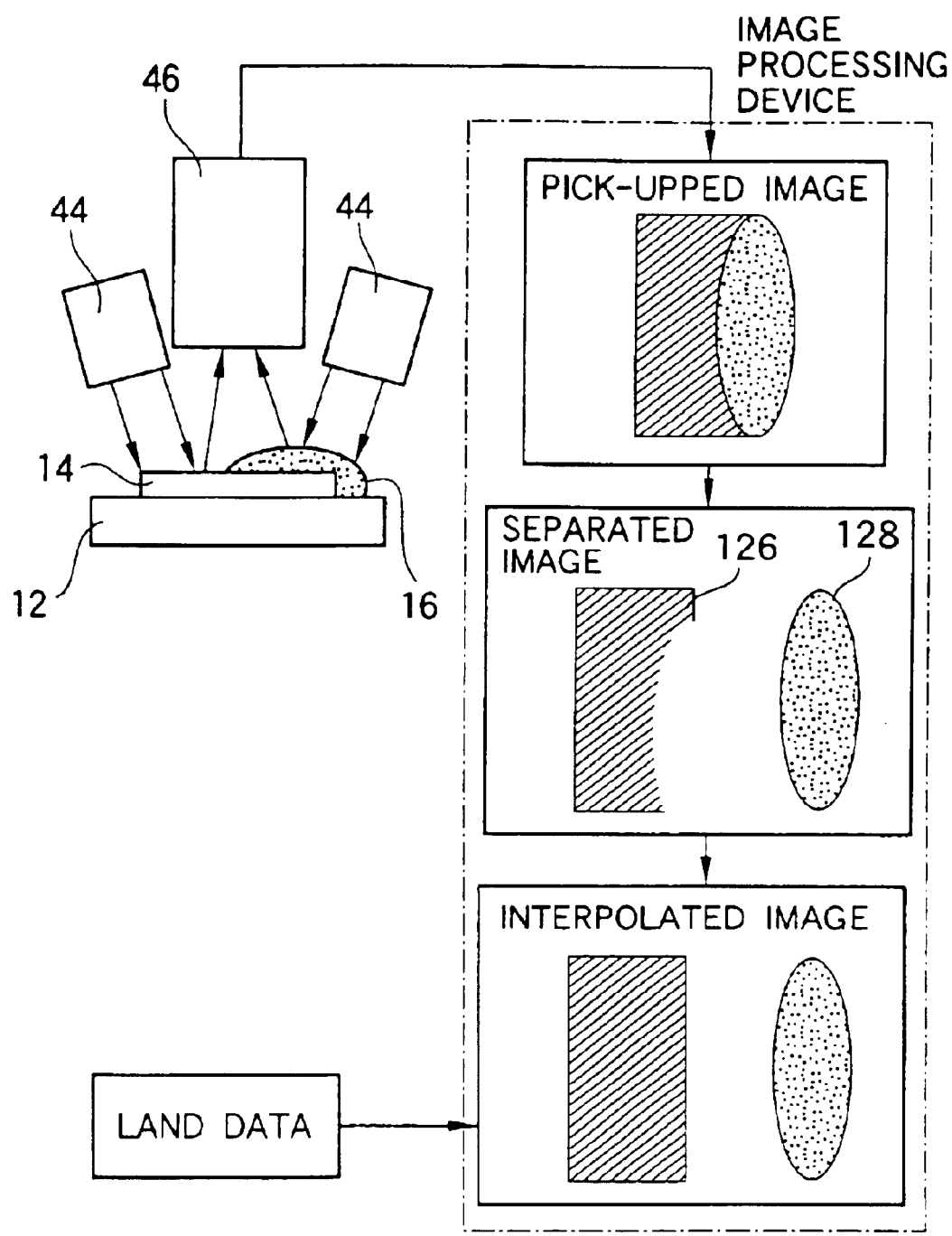
FIG. 14 is a view schematically illustrating the contents of check obtained by the inspecting apparatus.
Figure 15:
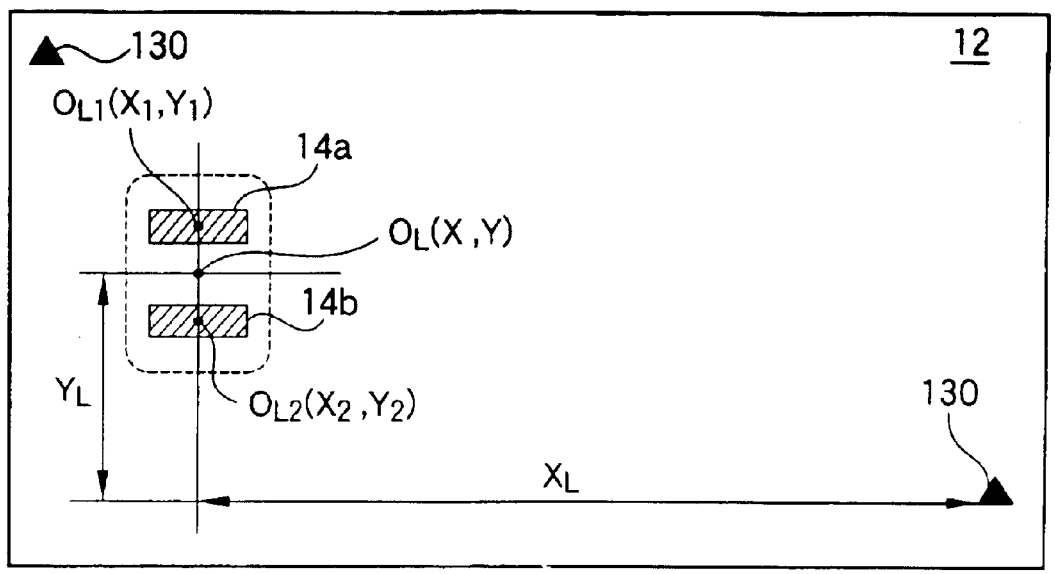
FIG. 15 is a diagram illustrating a state in which the central position of the shape of a land is to be measured.

Referring to FIG. 14 schematically showing the contents of inspection, in the inspecting apparatus 200, a land 14 formed on the circuit board 12 and the solder paste 16 printed by setting the land 14 in a target position are illuminated by the light source 44 and an image is picked up by the image pick-up camera 46. The image thus picked up is separated into a land portion 126 and a solder paste portion 128 based on a difference in a luminance of each pixel through an image processing and the missed portion of the land which is interposed between the solder paste 16 and the circuit board 12 and of which image is not picked up is reproduced by an interpolating process by using prepared land data registering the shape of the land. For example, it is possible to accurately reproduce a complete shape of the land by precisely detecting the feature of the shape of the land other than the missed portion (an edge component such as a corner portion or a side of which image is picked up) and estimating the position of the feature of the residual shape from the position of the feature of the shape thus detected while carrying out collation with the shape of the land which is registered in the land data, Next, the position of the center of the land shape thus separated and reproduced is measured (S11). As shown in FIG. 15, center-of-gravity positions $O^{L1}$ ($x^1$, $y^1$) and $O^{L2}$ ($x^2$, $y^2$) of the lands 14a and 14b of the circuit board 12 are measured by setting, as a reference position, any board mark 130 for alignment which is provided in the diagonal line position of the circuit board 12 (or an individual mark provided for another purpose). A middle point connecting the center-of-gravity positions $O^{L1}$ and $O^{L2}$ are set to a land center point $O^L$ ($x^L$, $y^L$).

Figure 16:
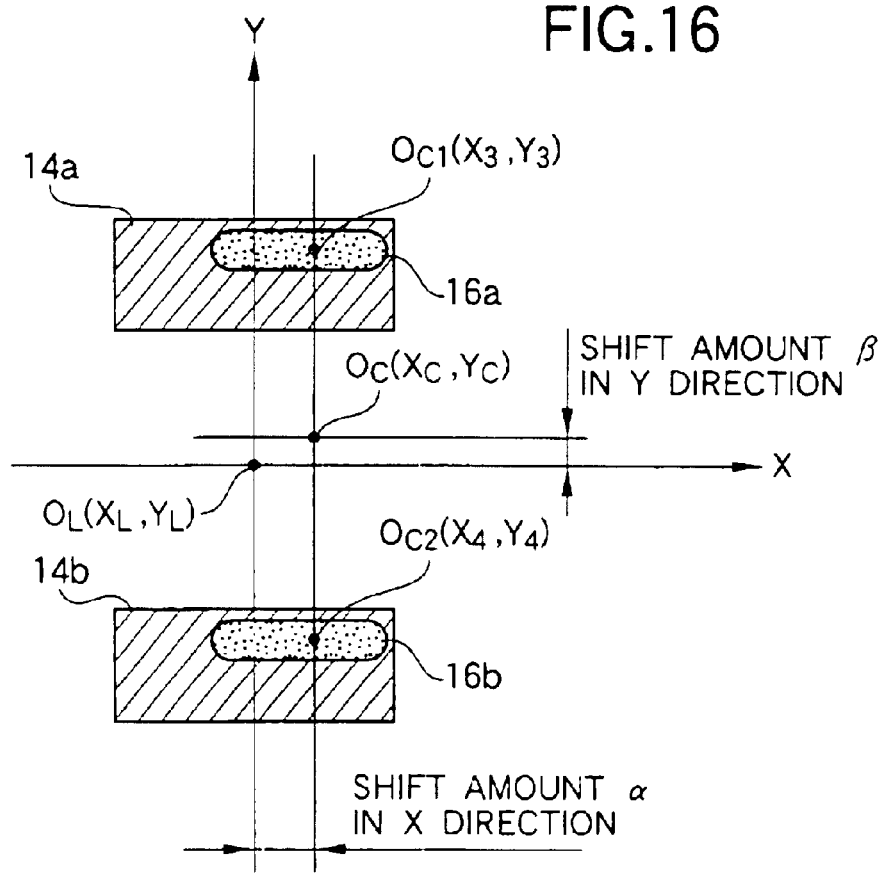
FIG. 16 is a view illustrating center-of-gravity positions $O_{C1}$ and $O_{C2}$ of the solder paste printed on the circuit board and shift amounts $\alpha$ and $\beta$ in X and Y directions.

Similarly, a solder paste printing position is measured from the separated solder paste portion 128 (S12). As shown in FIG. 16, center-of-gravity positions $O^{C1}$ ($x^3$, $y^3$) and $O^{C2}$ ($x^4$, $y^4$) of the solder pastes 16a and 16b printed on the circuit board 12 are measured. A middle point connecting the center-of-gravity positions $O^{C1}$ and $O^{C2}$ is set to a solder paste center point $O^C$ ($x^C$, $y^C$). Thus, the land center position $O^L$ and the solder paste center position $O^C$ are determined. Therefore, shift amounts α and β in the X and Y directions are obtained from the center positions $O^L$ and $O^C$ (S13).

Figure 17:
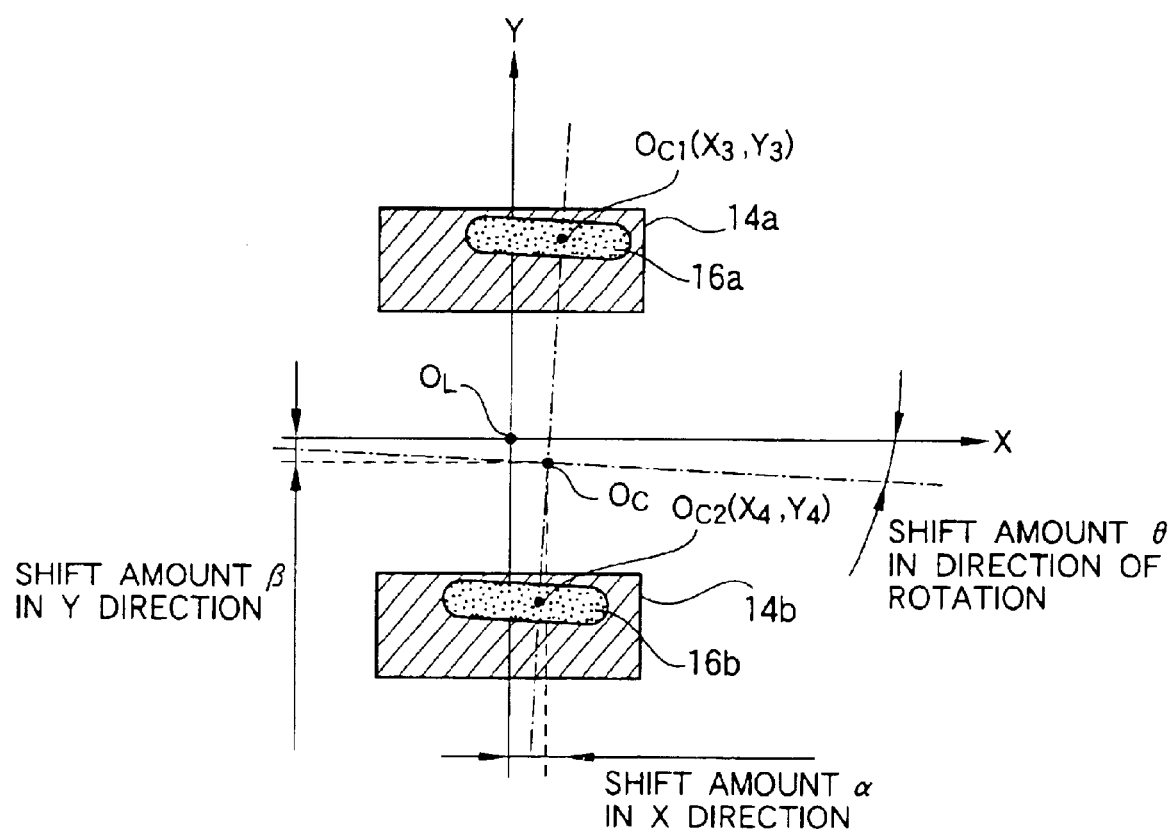
FIG. 17 is a view illustrating a shift amount θ in the direction of rotation of the solder paste printed on the circuit board.

Next, the shift amounts α and β thus obtained are compared with a predetermined allowable value of a shift (S14). If the shift amounts α and β are equal to or greater than the allowable value of a shift, there is a possibility that the shift might be caused in the direction of rotation as shown in FIG. 17. Therefore, a shift amount θ in the direction of rotation is measured (S15). The shift amount θ is obtained by an equation (1), for example.

$$\theta = \tan^{-1}\{(y^3+y^4)/(x^3-x^4)\} \qquad (1)$$

If the shift amounts α and β are smaller than the allowable value of a shift, the measurement of the shift amount θ in the direction of rotation is omitted to assume θ=0. Also in the case in which the amounts α and β are smaller than the allowable value of a shift, the shift amount θ in the direction of rotation may be obtained positively.

By using the shift amounts α, β and θ in the X and Y directions and the direction of rotation between the position of the land and the printing position of the solder paste, the electronic component 18 is mounted by using the printing position of the solder paste to be a reference as shown in FIG. 2 (S16). More specifically, the electronic component 18 is mounted by controlling the X-axis motor 98a, the Y-axis motor 98b, the Z-axis motor 98c and the θ-axis motor 98d (see FIG. 11) which are mounted on the XY robot and the attachment head in the electronic component mounting apparatus 300 such that the central position of the electronic component 18 is coincident with the central positions of the solder pastes 16a and 16b printed with the shift amounts of α, β and θ with respect to the lands 14a and 14b.

The target mounting position can also be varied successively on the electronic component mounting apparatus 300 side during the mounting of the electronic component, and furthermore, the mounting position recorded in the NC program 114 of the mounting data shown in FIG. 12 may be changed, for example. Moreover, the target mounting position may be changed to carry out 100% correction with respect to each of the shift amounts of α, β and θ. Furthermore, the shift amount may be changed by an optional rate between 0 and 100% for the shift amount. In this case, a fine control can be carried out to make the best of the self-alignment effect that is changed on slightly conditions and the optimum mounting state can be obtained.

According to the electronic component mounting method described above, the result of detection of the printing position, which is output at the printing position detecting step, is subjected to a feed-forward control to the mounting step. Consequently, it is possible to instantaneously set, as a solder paste printing position reference, the target mounting position of the electronic component on the circuit board to be a object for detecting solder paste printing position. Moreover, the self-alignment effect in which the electronic component once mounted is moved to a normal land position by the reflow process can be produced at a maximum and a bridge can be prevented from being generated by the unnecessary "extension wetting" of the solder over the side surface of the electronic component terminal also in the circuit board having a small mounting interval between the electronic components, and it is possible to maintain the quality of the circuit board which has been subjected to the mounting to be high and to stably mount the electronic component at a high density. Moreover, since an optimum target mounting position can be set for each electronic component, the precision in the mounting can be enhanced.

In the electronic component mounting method, the position of the land is not measured but only the printing position of the solder paste may be detected to mount the electronic component by setting the printing position of the solder paste to be the target mounting position.

Next, description will be given to a second embodiment of the electronic component mounting method according to the invention.

While the position of the land and the printing position of the solder paste are detected every electronic component for each electronic component to be mounted on the circuit board and the shift amounts thereof are obtained to change the mounting position of the electronic component in the first embodiment, a shift amount between the position of a land and the position of a printed solder paste is obtained for all the electronic components to be mounted on the circuit board and an average value of the shift amount for each electronic component is calculated to collectively change the mounting position of the electronic component on the circuit board based on the average value of the shift amount thus obtained in the second embodiment.

A specific changing procedure will be described below. For example, in the case in which N electronic components are to be mounted on the circuit board, each shift amount is set in the following manner in order of mounting for NC data to be mounting data.

| Data 1 : | $\alpha_1$, | $\beta_1$, | $\theta_1$ |
|---|---|---|---|
| Data 2 : | $\alpha_2$, | $\beta_2$, | $\theta_2$ |
| Data 3 : | $\alpha_3$, | $\beta_3$, | $\theta_3$ |
| ... | | | |
| Data N : | $\alpha_N$, | $\beta_N$, | $\theta_N$ |

An X-direction correction value, a Y-direction correction value and a θ-direction correction value are set from the shift amounts by using equations (2) to (4).

$$X\text{-direction correction value}=(\alpha^1+\alpha^2+\alpha^3+\ldots+\alpha^N)/N \quad (2)$$

$$Y\text{-direction correction value}=(\beta^1+\beta^2+\beta^3+\ldots+\beta^N)/N \quad (3)$$

$$\theta\text{-direction correction value}=(\theta^1+\theta^2+\theta^3+\ldots+\theta^N)/N \quad (4)$$

The correction values in the equations (2) to (4) are applied to all the electronic components to be mounted on the circuit board and the mounting is carried out by collectively changing the target mounting position. As compared with the case in which the mounting positions are individually changed for the electronic components, consequently, the amount of a whole calculation process can he reduced and the speed of the mounting operation can be increased.

Next, description will be given to a third embodiment of the electronic component mounting method according to the invention.

While the amount of the shift of the solder paste printed on the circuit board from the land is averaged and the target mounting position is changed in one way with respect to all the electronic components in the second embodiment, the circuit board is divided into the optional number of blocks, and the average value of a shift amount is obtained for each block and the mounting position of the electronic component is changed for each block by using the average value of each block thus obtained in the third embodiment.

A pattern for dividing the circuit board into the optional number of blocks includes a dividing pattern shown in FIG. 18, for example. FIG. 18(a) shows an example in which the circuit board is divided annularly into regions from the peripheral edge of the circuit board toward a center and FIG. 18(b) shows an example in which the circuit board is divided into regions like a lattice. In the dividing pattern shown in FIG. 18(a), the shift amount of a central portion (region C) of the circuit board is small and tends to be increased toward a peripheral edge portion (block A). In this case, the target mounting position of the electronic component is set by using a small correction value for a small shift amount in the block C and a great correction value for a large shift amount in the block A, respectively. In the dividing pattern shown in FIG. 18(b), moreover, the shift amount is small in a corner portion (for example, the block A) and tends to be increased apart from the corner portion. In this case, the target mounting position is set by using a small correction value in the block A and a great correction value in other blocks respectively.

More specifically, set shift amounts (correction values) $\alpha i$, $\beta i$ and $\theta i$ (i is 1 to M) in the blocks are expressed in equations (5) to (7), wherein the number of region divisions (the number of blocks) is represented by M and the number of mounted components in each block is represented by Naj (j is 1 to M).

$$\alpha i=(\alpha ij+\ldots+\alpha iMNaj)/Naj \quad (5)$$

$$\beta i=(\beta ij+\ldots+\beta iMNaj)/Naj \quad (6)$$

$$\theta i=(\theta ij+\ldots+\theta iMNaj)/Naj \quad (7)$$

α ij, β ij and θ ij represent shift amounts for a jth electronic component in a block i.

By individually setting the correction value to each block, thus, the target mounting position of a block having a small shift amount can be prevented from being greatly shifted by the influence of a block having a large shift amount. Consequently, it is possible to carry out the mounting over the circuit board with precision in uniform alignment.

Next, description will be given to a fourth embodiment of the electronic component mounting method according to the invention.

In the embodiment, as shown in FIG. 19, various parameters such as the weight and shape of an electronic component to be mounted, the material composition of a solder paste to be used, a friction property, a viscosity, a solder powder size, a melting point, a flux component (a resin base, an organism base and an inorganism base), a flux activity or a printing thickness are arranged in a table and a self-alignment ratio is assumed depending on the combination of the type of an electronic component to be actually used and the material of the solder paste by utilizing the table. The self-alignment ratio represents an index indicating, as a percentage, the degree of a shift from the center of the printed solder paste that self-alignment is effective. Based on the self-alignment ratio, the degree (for example, 50%, 80% or 100%) of the shift amount of the printing position of the solder paste to be utilized as a correction value for setting a target mounting position is set.

While the parameter table for the solder paste is registered as the solder data 124 in a part of mounting data as shown in FIG. 12, it is not restricted but may have such a structure as to be registered in other data regions, for example, the NC program 114 and the array program 116. For the contents of registration, moreover, the manufacturer type name of a solder paste can also be set in addition to each parameter. In this case, each characteristic parameter corresponding to the type name can be previously registered in the table and can be collectively set automatically in the table. Consequently, a work for inputting the mounting data can be simplified considerably.

According to the embodiment, the correction value can be properly changed for each mounting component depending on the combination of the type of the electronic component to be used actually and the type of the solder paste so that the electronic component to be mounted can obtain a greater self-alignment effect. Moreover, the correction value is set by directly reflecting the self-alignment effect. Consequently, precision in component mounting can be enhanced still more.

Next, description will be given to a fifth embodiment of the electronic component mounting method according to the invention.

In the embodiment, as shown in FIG. 20, a self-alignment effect is determined to some extent depending on the printing position of a solder paste for the position of a land. Therefore, whether the printing position of the solder paste is set to a target mounting position or the position of the land is set to the target mounting position is selected depending on the shift state of the printing position of the solder paste.

FIG. 20(a) shows a state in which the solder paste is printed with a shift from the centers of lands 14a and 14b. In this case, the self-alignment effect can be obtained sufficiently. FIG. 20(b) shows a state in which the solder paste is printed with a protrusion from the lands 14a and 14b. In this case, the solder paste is divided out of the land during reflow so that the self-alignment effect is reduced.

In the embodiment, the printing state of the solder paste is thus detected so that the self-alignment ratio is assumed and the target mounting position is determined depending on the self-alignment ratio. FIG. 21 is a flow chart showing the electronic component mounting method according to the embodiment. First of all, the images of the position and shape of a land are picked up and recognized by an inspecting apparatus 200 (S20). Moreover, the printing position and shape of the solder paste are recognized (S21). From these results of recognition, a self-alignment ratio is decided (S22). If the self-alignment ratio is high, the printing position of the solder paste is set to a target mounting position (S23). If the self-alignment ratio is low, the position of the land is set to the target mounting position (S24), Consequently, in the case in which the print shift of the solder paste is great, it is possible to prevent an electronic component from being mounted in a position in which the self-alignment effect cannot be sufficiently obtained and being fixed with a shift after a reflow process.

Next, description will be given to a sixth embodiment of the electronic component mounting method according to the invention.

Figure 22:
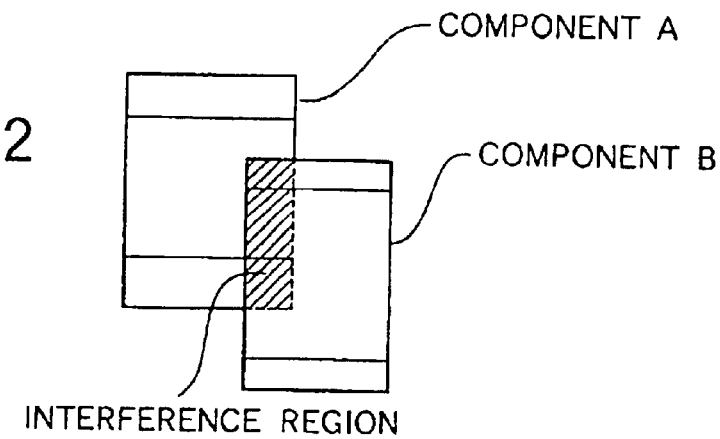
FIG. 22 is a view showing a state in which adjacent electronic components interfere with each other.

In the embodiment, in the case in which the printing position of a solder paste is set to a target mounting position to mount an electronic component, it is supposed that the adjacent electronic components interfere with each other as shown in FIG. 22. By previously obtaining the presence of the interference through a calculation before the mounting, the generation of a failure in mounting can be prevented.

More specifically, the mounting position of the electronic component recorded in an NC program 114 provided in the mounting data shown in FIG. 12 and the contour of the electronic component based on a component size recorded in a component library 118 are obtained and it is decided whether or not the contour in the mounting position obtained after correcting the shift amount of the printing position of the solder paste and the contour of the adjacent components interfere with each other. If there is no interference, the mounting process is exactly carried out. If there is the interference, the component is not mounted. If there is the interference, moreover, the mounting position may be corrected to such a position that the electronic components do not interfere with each other, thereby carrying out the mounting. In this case, it is possible to prevent a recovery process from being carried out due to the stop of the mounting operation for the electronic component. Thus, the mounting step can be executed more quickly. For the correction of the mounting position, it is also possible to use a method of successively changing a target mounting position during the mounting to be carried out or a method of rewriting the mounting position of the NC program 114 to carry out the mounting.

Consequently, the generation of a mounting failure can be prevented and the productivity of a circuit board can be prevented from being deteriorated.

Next, description will be given to a variant of an electronic component mounting system for implementing the electronic component mounting method according to each embodiment described above.

Figure 23:
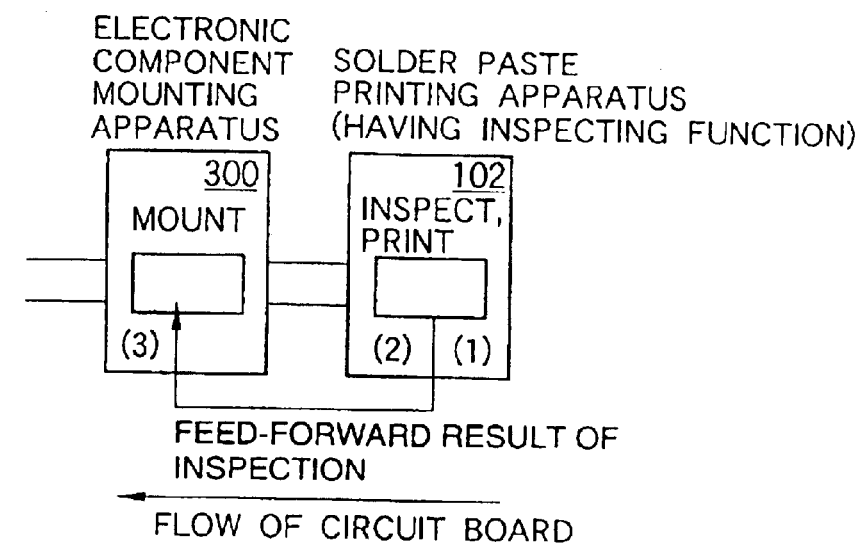
FIG. 23 is a view showing an example of a structure according to a first variant of an electronic component mounting system for implementing the electronic component mounting method according to each embodiment.

FIG. 23 is a view showing an example of the structure of the electronic component mounting system according to a first variant. In the variant, there is provided a structure using a solder paste printing apparatus 102 having a inspecting function integrating the function of the solder paste printing apparatus 100 with that of the inspecting apparatus 200. In this case, the solder paste printing apparatus 102 can be implemented by using the board recognizing camera 36 or the mask recognizing camera 38 shown in FIG. 6 for detecting the position of a land and the printing position of a solder paste, for example. Moreover, a inspecting portion may be added separately. With such a structure, an installation space can be reduced and a process for delivering a circuit board can be simplified so that the process can be carried out more quickly.

Figure 24:
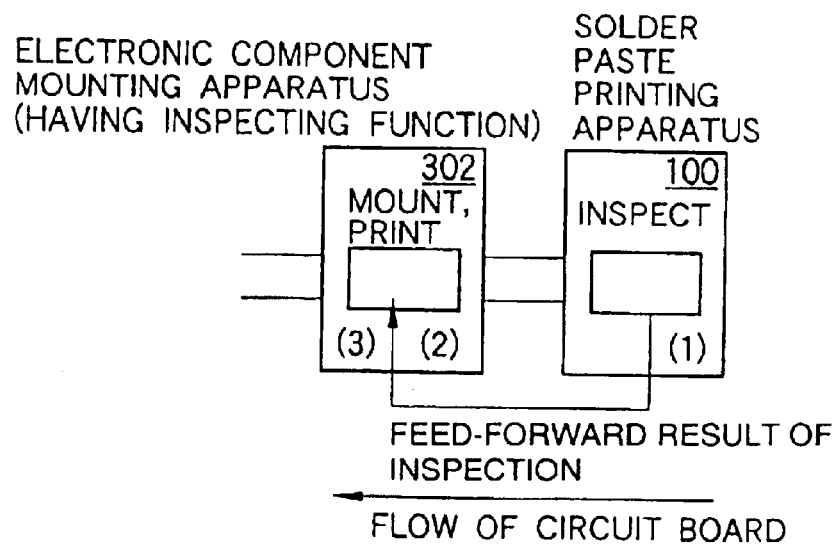
FIG. 24 is a view showing an example of a structure according to a second variant of the electronic component mounting system for implementing the electronic component mounting method according to each embodiment.

FIG. 24 is a view showing an example of the structure of the electronic component mounting system according to a second variant. In the variant, there is provided a structure using an electronic component mounting device 302 having a inspecting function integrating the function of the inspecting apparatus 200 with that of the electronic component mounting apparatus 300. In this case, the electronic component mounting apparatus 302 can be implemented by using a board recognizing camera for detecting a board mark for alignment in order to detect the position of a land and the printing position of a solder paste, for example. Moreover, a inspecting unit may be added separately. Such a structure can also reduce an installation space and simplify a process for delivering a circuit board so that the process can be carried out more quickly.

Figure 25:
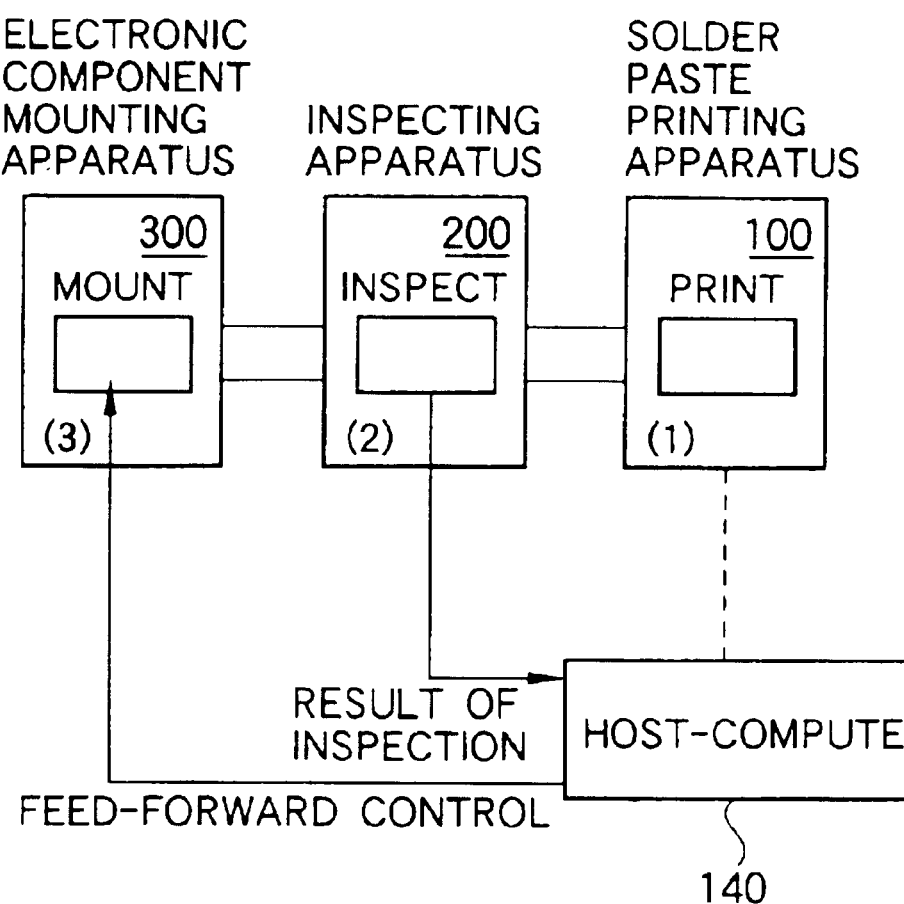
FIG. 25 is a view showing an example of a structure according to a third variant of the electronic component mounting system for implementing the electronic component mounting method according to each embodiment.

FIG. 25 is a view showing an example of the structure of the electronic component mounting system according to a third variant. In this case, a solder paste printing apparatus 100, a inspecting apparatus 200 and an electronic component mounting apparatus 300 are connected to a host computer 140 respectively and each device is generally controlled by the host computer 140. The result of inspection of a solder paste printing position shift sent from the inspecting apparatus 200 is input to the host computer 140, and the host computer 140 outputs the input position shift information to the electronic component mounting apparatus 300 to carry out a feedforward control. According to such a structure, the electronic component mounting system can be generally managed. In addition, also in the case in which a circuit board manufacturing line is formed by a plurality of mounting systems, they can is be easily connected to carry out the control.

While the mounting data (mounting program) are created over the electronic component mounting apparatus 300 in the electronic component mounting system described above, the same data may be created by another external device (a mounting data creating device) to be connected to the electronic component mounting apparatus 300 through a communication line or a recording medium. In this case, the mounting data created by the mounting data creating device are fetched into the electronic component mounting apparatus 300 so that the mounting operation can be carried out. Also during the mounting operation of the electronic component mounting apparatus 300, the mounting data can be created. Therefore, a workability for data creation can be enhanced and the operating efficiency of producing equipment can be increased.

Figure 26:
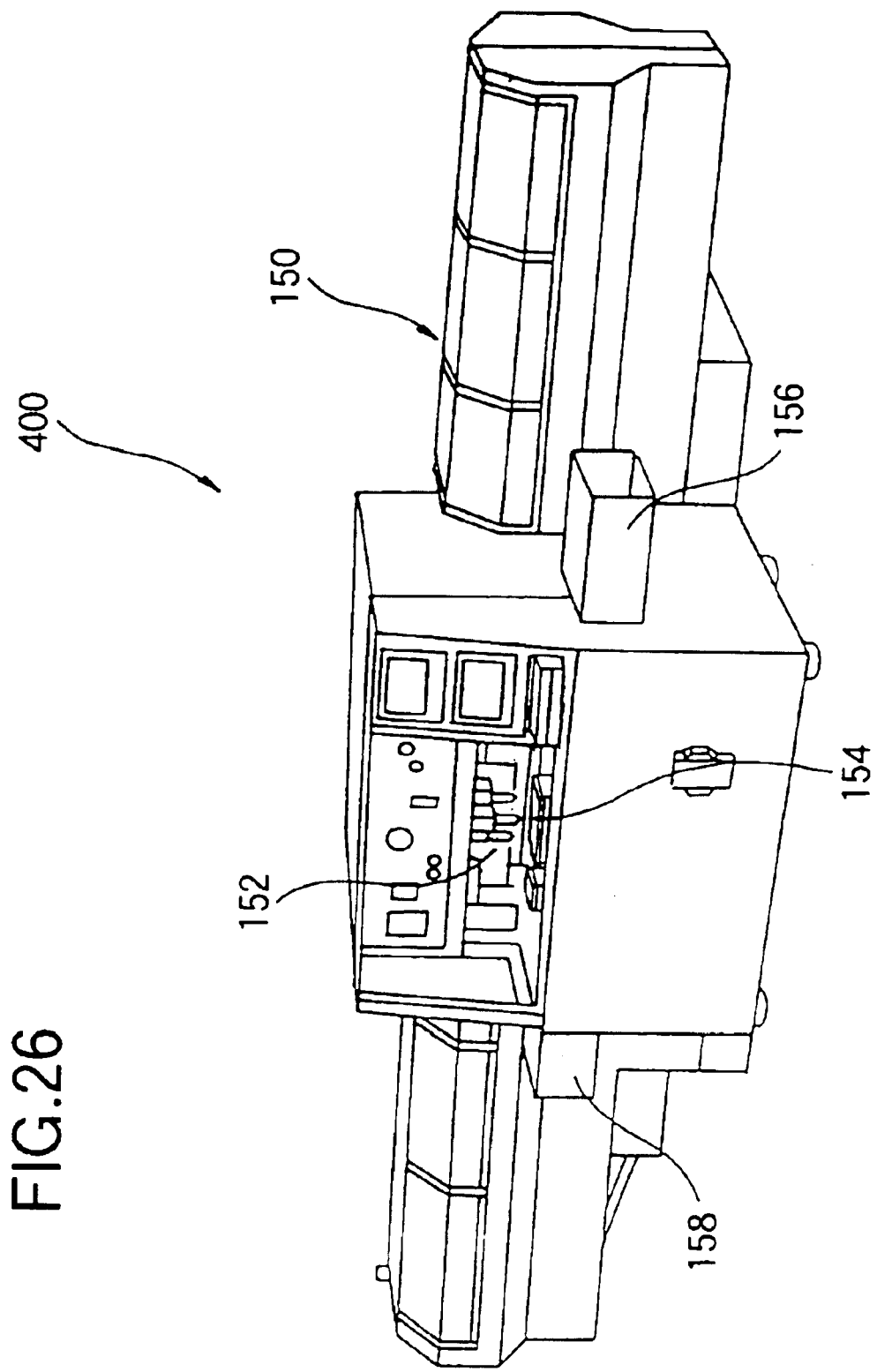
FIG. 26 is a view showing the appearance of an electronic component mounting apparatus including a rotary head.
Figure 27:
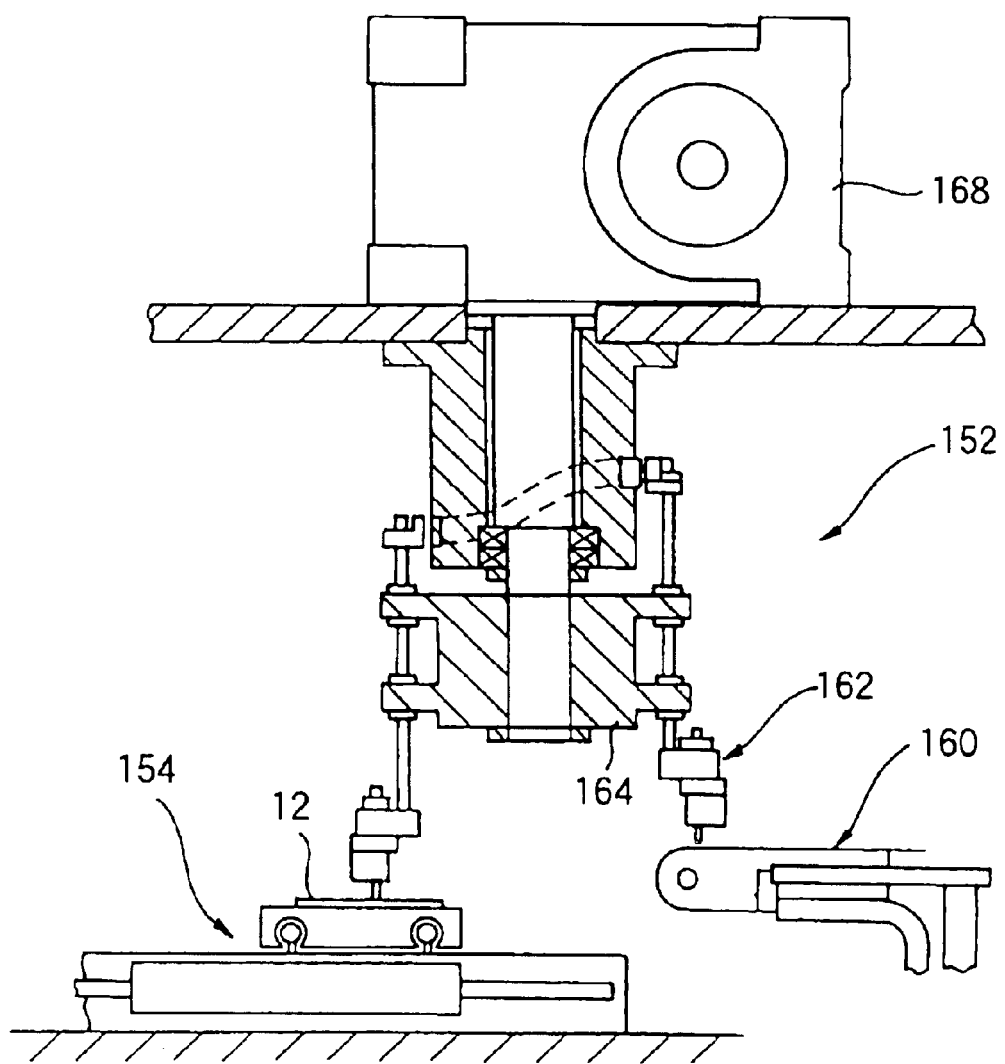
FIG. 27 is a schematic sectional view showing the rotary head for explaining the operation of the rotary head.

Moreover, while the electronic component mounting apparatus 300 has such a structure that the circuit board to mount the electronic component thereon is fixed and a transfer head provided with an attachment head is moved over the circuit board to carry out the mounting operation, the invention is not restricted thereto but the electronic component mounting method according to the invention can be similarly applied to an electronic component mounting apparatus including a rotary head as shown in FIGS. 26 and 27, for example.

FIG. 26 is a view showing the appearance of the electronic component mounting apparatus including the rotary head and FIG. 27 is a schematic sectional view showing the rotary head for illustrating the operation of the rotary head. An electronic component mounting apparatus 400 mainly has a component feeding portion 150 for continuously feeding an electronic component, a rotary head 152 for holding the electronic component in the predetermined component feeding position of the component feeding unit 150 and for mounting the electronic component on the circuit board, and an X-Y table 154 for positioning the circuit board. Consequently, the circuit board fed from a board delivery-in portion 156 is mounted on the X-Y table 154 and the electronic component sent from the component feeding unit 150 is held by the rotary head 152, and a proper correcting process is then carried out to s mount the electronic component on the circuit board. The circuit board having the component mounted thereon is delivered from the X-Y table 154 to a board delivery-out portion 158.

In a compartment feeding unit 10, a plurality of component feeding members 160 accommodating a large number of electronic components are arranged in a vertical direction on a paper as shown in FIG. 27 and a compartment feeding member 160 is moved in the direction of the arrangement, thereby feeding a desirable electronic component to a component feeding position.

The X-Y table 154 is provided movably between the board delivery-in unit 156 and the board delivery-out unit 158, is moved to a position to be connected to the board delivery path of the board delivery-in unit 156 to receive the circuit board which has not attached the component, and fixes the circuit board and is moved to the component mounting position of the rotary head 152. Then, the movement of the circuit board 12 corresponding to the mounting position of each electronic component is repeated. When the attachment of the component is completed, the XY table 154 is moved to a position to be connected to the board delivery-out unit 158 and feeds the circuit board 12 to the board delivery-out unit 158.

The rotary head 152 includes a plurality of attachment heads 162 for sucking an electronic component, a s rotating frame member 164 to be rotated by supporting the attachment head 162 on a peripheral surface vertically movably, and an intermittent rotating device 168 for index rotating the rotating frame member 164.

An attachment head 262 is continuously rotated and moved from the component feeding position of the component feeding unit 150 to a component attachment position on the opposite side thereof by the rotation of the rotating frame member 164, falls down in the component feeding position of the component feeding unit 150 to adsorb the electronic component, and recognizes the sucking attitude of the electronic component in a certain component recognition position of the component recognizing device to fall down in the component attachment position, thereby attaching the electronic component onto the circuit board 12.

The electronic component mounting method according to the embodiment can also be applied to the electronic component mounting apparatus 400 including such a rotary head and the same effects can be obtained.

Description will be given to the result of a difference in a self-alignment effect based on a difference between the mounting position of an electronic component and the printing position of a solder paste.

Figure 28A:
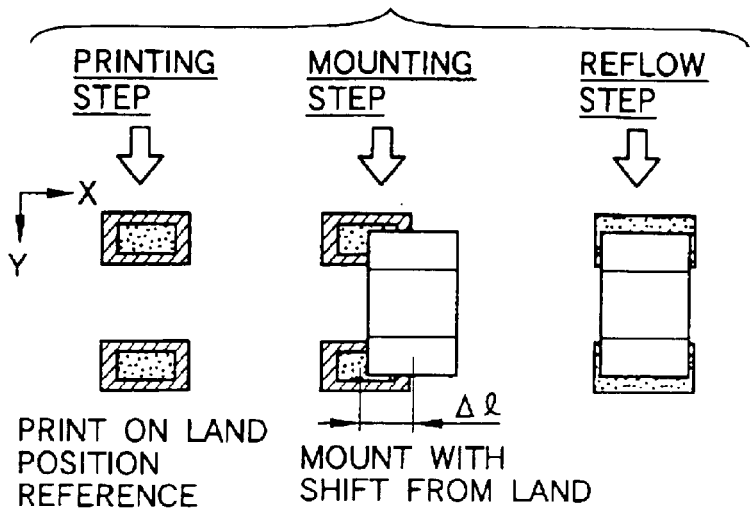
FIGS. 28(a) through 28(c) are diagrams showing results obtained by comparing self-alignment effects on two conditions.
Figure 28B:
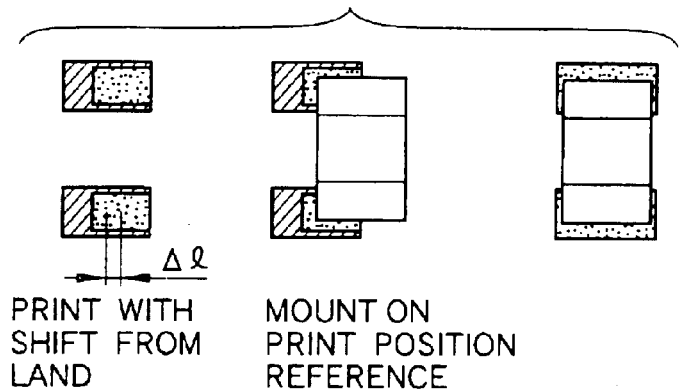
Figure 28C:
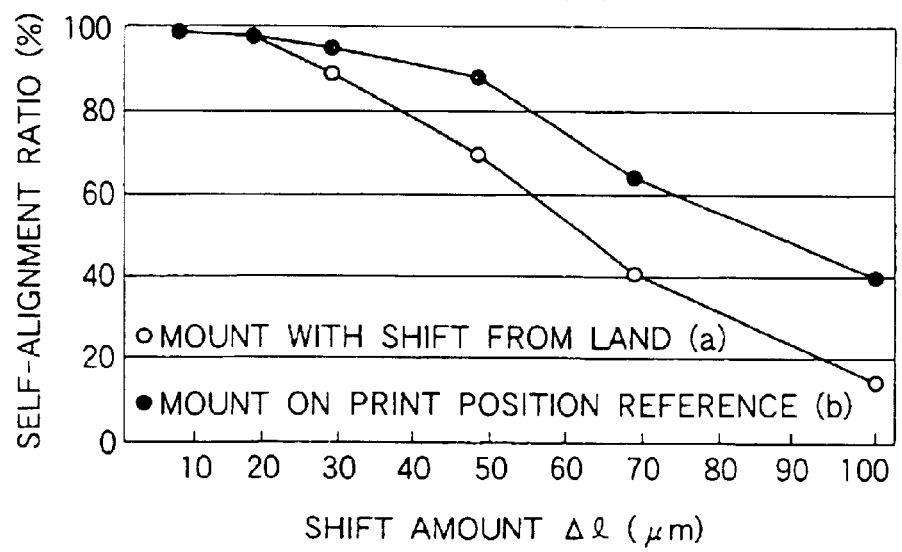
Figure 31A:
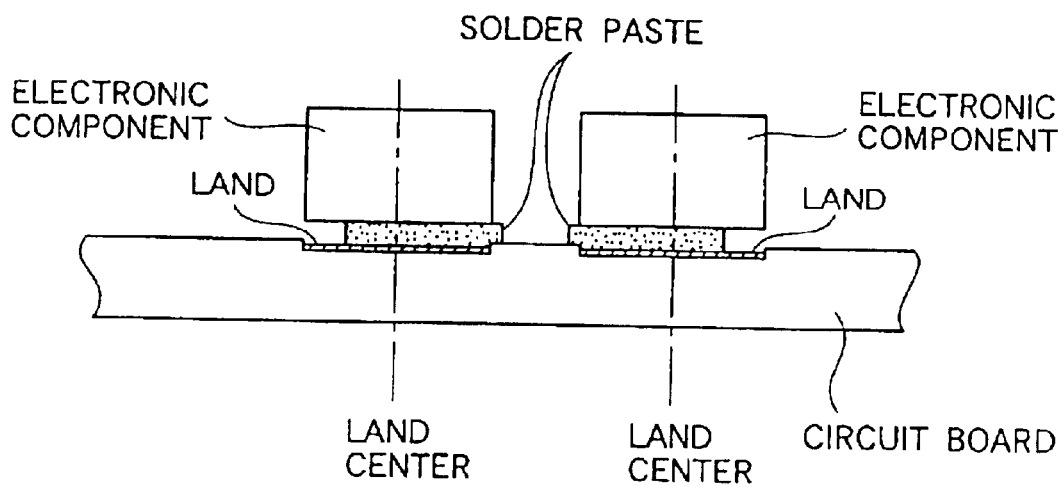
FIG. 31(a) and FIG. 31(b) are views showing failures in soldering caused by the shift of the printing position of a solder paste.
Figure 31B:
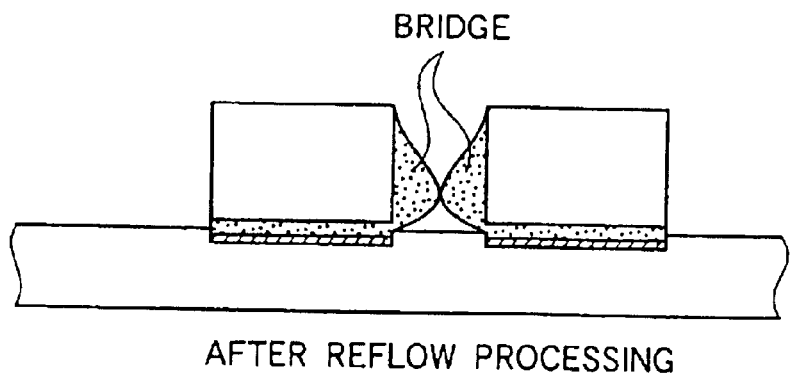

FIG. 28 shows a result of comparison of the self-alignment effects on two conditions. FIG. 28(a) shows a state in which a solder paste is printed on a land position reference and an electronic component is mounted in a position shifted by Δ1, FIG. 28(b) shows a state in which the solder paste is printed with a shift from the position of the land by Δ1 and the electronic component is mounted in the printing position of a solder paste, and FIG. 28(c) is a graph showing a self-alignment ratio obtained in FIGS. 28(a) and (b). An axis of abscissa in the graph indicates an average value obtained by a shift in each of X and Y directions, and the used electronic component is referred to as a "0603 chip" having a size of 0.6 mm×0.3 mm. Moreover, the self-alignment ratio represents a probability of a return to a position within ±10 μm from a land center to be a reference.

As shown in the graph of FIG. 28(c), in the case (a) in which only the mounting position of the electronic component is shifted, the self-alignment ratio is considerably reduced with an increase of the shift amount Δ1 as compared with the case in which the mounting is carried out on the printing position reference. For example, when the shift amount Δ1 is 50 μm, the self-alignment ratio is reduced to 70% in the (a), while the self-alignment ratio is 90% in the case (b). Consequently, it is apparent that the electronic component is mounted in the printing position of the solder paste so that a greater self-alignment effect can be expected than that in the case in which the electronic component is mounted in the position of the land.

According to the electronic component mounting method and apparatus in accordance with the invention, the printing position of the solder paste of the circuit board is detected at the printing position detecting step and the electronic component is mounted by using the printing position of the solder paste thus detected as a reference at the mounting step. Consequently, when the solder paste is molten by a reflow process, a self-alignment effect of returning the electronic component to the position of a land by the fluidization of the solder paste can be maintained to be great, and the electronic component ran be reliably fixed into the position of the land even if the printing position of the solder paste is shifted from the position of the land. Also in the case in which the mounting interval of the electronic component is small, moreover, it is possible to enhance precision in the mounting position of the electronic component by effectively utilizing the self-alignment effect.

Moreover, the electronic component mounting system in accordance with the intention includes a printing position detecting device for detecting a printing position of the solder paste of the circuit board, and an electronic component mounting apparatus for mounting an electronic component based on a result of detection of the printing position The electronic component is mounted by using the printing position of the solder paste as a reference Consequently, the self-alignment effect of returning the electronic component into the position of the land can be maintained to be great and the electronic component can be reliably fixed in the position of the land after the reflow process of the circuit board.

According to the electronic component mounting data creating method in accordance with the invention, furthermore, the mounting data for carrying out a mounting operation based on the electronic component mounting method can be created easily with reference to a previously registered table through the electronic component mounting apparatus or the mounting data creating device connected thereto.

According to the mounting data creating device in accordance with the invention, moreover, the mounting data for mounting the electronic component on the circuit board are created irrespective of the electronic component mounting apparatus, and the electronic component mounting apparatus is subsequently caused to fetch the mounting data thus created. Consequently, even if the electronic component mounting apparatus is carrying out the mounting operation, the mounting data can be created. Thus, a workability for data creation can be enhanced and the operating efficiency of producing equipment can be increased.

According to the program in accordance with the invention, the program recording mounting data for mounting an electronic component on a circuit board based on the electronic component mounting method is used for an electronic component mounting apparatus. Consequently, it is possible to mount the electronic component with the self-alignment effect enhanced.

What is claimed is:

1. A electronic component mounting method for mounting an electronic component comprising the steps of:
   providing a circuit board further comprising a land;
   dividing the circuit board into a plurality of blocks;
   printing a solder paste on the land;
   detecting a printing position of the solder paste on the circuit board;
   mounting the electronic component on the circuit board by referring to the printing position of the solder paste as a reference;
   obtaining a shift amount between a position of the land corresponding to the electronic component to be mounted in each block and the printing position of the solder paste for the land; and
   setting a target mounting position of the electronic component for each block based on the shift amount thus obtained.

2. The method according to claim 1, further comprising the step of:
   feed-forward controlling a detected result of the printing position of the solder paste from the step of detecting to the step of mounting,
   wherein the detected result is an output at the step of detecting.

3. The method according to claim 1,
   wherein the blocks are obtained by an annular division from a peripheral edge of the circuit board toward a center.

4. The method according to claim 1,
   wherein the blocks are obtained by dividing the circuit board like a lattice.

5. A electronic component mounting method for mounting an electronic component comprising the steps of:
   providing a circuit board further comprising a land;
   printing a solder caste on the land;
   detecting a printing position of the solder paste on the circuit board;
   mounting the electronic component on the circuit board by referring to the printing position of the solder paste as a reference;
   deciding a self-alignment effect from a shift state between a position of a land corresponding to the electronic component to be mounted and the printing position of the solder paste for the land;
   setting a target mounting position of the electronic component by using the printing position of the solder paste as a reference in a case that the self-alignment effect is great; and
   setting the target mounting position by using the position of the land as the reference in a case that the self-alignment effect is small.

6. The method according to claim 5,
   wherein the step of mounting is not carried out in the case that the electronic component interferes with adjacent other electronic components on the circuit board.

7. The method according to claim 5, further comprising the step of:
   changing the target mounting position of the electronic component to be mounted toward the position of the land and from the printing position of the solder paste to a position in which the interference is not present in the case that the electronic component interferes with adjacent other electronic components on the circuit board.

8. The electronic component mounting method according to claim 5, wherein the step of detecting includes the steps of:
   picking up an image of a circuit board having a solder paste printed thereon;
   reproducing a shape of a land hidden in the solder paste by interpolating the picked-up image with referring previously registered land data; and
   obtaining a center of a position of the land from the shape of the land thus reproduced.

9. A electronic component mounting method for mounting an electronic component comprising the steps of:
   providing a circuit board further comprising a land;
   printing a solder paste on the land;
   detecting a printing position of the solder caste on the circuit board;

mounting the electronic component on the circuit board by referring to the printing position of the solder taste as a reference;

setting a correction value at an optional rate for a shift amount between a position of a land corresponding to the electronic component to be mounted and the printing position of the solder paste for the land; and changing a target mounting position of the electronic component from the position of the land toward the printing position of the solder paste based on the correction value thus set.

10. The method according to claim 9, wherein the correction value is set based on a degree of the self-alignment effect which is determined depending on a shift state between the position of the land corresponding to an electronic component to be mounted and the printing position of the solder paste for the land.

11. The method according to claim 9, wherein the correction value is set depending on a characteristic of a solder paste to be used.

12. A electronic component mounting method for mounting an electronic component comprising the steps of:

providing a circuit board further comprising a land;

dividing the circuit board into a plurality of blocks;

printing a solder paste on the land;

detecting a printing position of the solder paste on the circuit board;

mounting the electronic component on the circuit board by referring to the printing position of the solder paste as a reference;

obtaining a shift amount in a direction of rotation and a shift amount in a horizontal direction in the case that a shift amount of a position of the land corresponding to the electronic component to be mounted from the printing position of the solder paste for the land exceeds a predetermined shift amount, and setting a target mounting position and a target rotating angle of the electronic component based on the shift amounts in the horizontal direction and the direction of rotation.

* * * * *

UNITED STATES PATENT AND TRADEMARK OFFICE
CERTIFICATE OF CORRECTION

PATENT NO.    : 6,904,672 B2
DATED         : June 14, 2005
INVENTOR(S)   : Nagafuku et al.

It is certified that error appears in the above-identified patent and that said Letters Patent is hereby corrected as shown below:

Column 13,
Line 50, delete "is".

Column 17,
Lines 63 and 64, delete "$O^{L1}$ $(x^1, y^1)$ and $O^{L2}$ $(x^2, y^2)$" and insert -- $O_{L1}$ $(x_1, y_1,)$ and $O_{L2}$ $(x_2, Y_2)$ --.

Column 18,
Line 2, delete "$O^{L1}$ and $O^{L\ 2}$" and insert -- $O_{L1}$ and $O_{L\ 2}$ --.
Line 3, delete "$O^L$ $(x^L, y^L)$" and insert -- $O_L$ $(X_L, Y_L)$ --.
Line 6, delete "$O^{C1}$ $(x^3, y^3)$ and $O^{C2}$ $(x^4, y^4)$" and insert -- $O_{C1}$ $(x_3, y_3)$ and $O_{C2}$ $(x_4, y_4)$ --.
Line 9, delete "$O^{C1}$ and $O^{C2}$" and insert -- $O_{C1}$ and $O_{C2}$ --.
Line 10, delete "$O^C$ $(x^C, y^C)$" and insert -- $O_C(x_C, y_C)$ --.
Line 11, delete "$O^L$" and insert -- $O_L$ --.
Line 11, delete "$O^C$" and insert -- $O_C$ --.
Line 14, delete "$O^L$ and $O^C$" and insert -- $O_L$ and $O_C$ --.
Above line 25, delete formula (1) and insert the following:
-- $\theta = \tan^{-1}\{(y_3+y_4)/(x_3-x_4)\}$ --.

Column 19,
Line 50, delete formula (2) and insert the following:
-- X-direction correction value $=(\alpha_1+\alpha_2+\alpha_3+...+\alpha_N)/N$ --.
Line 52, delete formula (3) and insert the following:
-- Y-direction correction value $=(\beta_1+\beta_2+\beta_3+...+\beta_N)/N$ --.
Line 54, delete formula (4) and insert the following:
-- $\theta$-direction correction value $=(\theta_1+\theta_2+\theta_3+...+\theta_N)/N$ --.

Column 23,
Line 51, before "mount" delete "s".

Column 24,
Line 9, before "rotating" delete "s".

Column 26,
Lines 20 and 66, delete "caste" and insert -- paste --.

UNITED STATES PATENT AND TRADEMARK OFFICE
CERTIFICATE OF CORRECTION

PATENT NO. : 6,904,672 B2
DATED : June 14, 2005
INVENTOR(S) : Nagafuku et al.

It is certified that error appears in the above-identified patent and that said Letters Patent is hereby corrected as shown below:

Column 27,
Line 2, delete "taste" and insert -- paste --.

Signed and Sealed this

Twenty-eighth Day of March, 2006

JON W. DUDAS
*Director of the United States Patent and Trademark Office*